United States Patent
Koo

(10) Patent No.: US 9,247,612 B2
(45) Date of Patent: Jan. 26, 2016

(54) LED DRIVING DEVICE AND LIGHTING DEVICE

(71) Applicant: SAMSUNG ELECTRONICS CO., LTD., Suwon-si, Gyeonggi-do (KR)

(72) Inventor: Nam Su Koo, Yongin-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/297,282

(22) Filed: Jun. 5, 2014

(65) Prior Publication Data

US 2015/0054422 A1    Feb. 26, 2015

(30) Foreign Application Priority Data

Aug. 21, 2013 (KR) .......................... 10-2013-0099238

(51) Int. Cl.
*H05B 33/08*  (2006.01)
*H05B 37/02*  (2006.01)

(52) U.S. Cl.
CPC ........ *H05B 33/0872* (2013.01); *H05B 37/0227* (2013.01); *H05B 37/0272* (2013.01)

(58) Field of Classification Search
None
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,622,869 B2 | 11/2009 | Watanabe et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |

(Continued)

*Primary Examiner* — Douglas W Owens
*Assistant Examiner* — Dedei K Hammond
(74) *Attorney, Agent, or Firm* — McDermott Will & Emery LLP

(57) ABSTRACT

An LED driving device includes a first converter configured to generate a first voltage, a second converter configured to generate a second voltage for driving a plurality of light emitting diodes (LEDs) from the first voltage, and a control circuit connected to an output terminal of the first converter and configured to control a level of the first voltage. The control circuit includes a cut-off circuit including a comparison circuit having hysteresis characteristics and a bleeder circuit.

20 Claims, 26 Drawing Sheets

(56) References Cited

U.S. PATENT DOCUMENTS

| | | |
|---|---|---|
| 8,324,646 B2 | 12/2012 | Lee et al. |
| 8,378,588 B2 | 2/2013 | Kuo et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2011/0080102 A1 | 4/2011 | Ge et al. |
| 2012/0194079 A1* | 8/2012 | Clauberg et al. .............. 315/125 |
| 2012/0286684 A1 | 11/2012 | Melanson et al. |
| 2013/0009559 A1 | 1/2013 | Niikura et al. |
| 2013/0057167 A1 | 3/2013 | Angeles |
| 2014/0159616 A1* | 6/2014 | Wang et al. ................... 315/307 |

* cited by examiner

| Channel Information (CH) | Wireless Network Identification Information (PAN_ID) | Device Address (Ded_Add) | Sensing Data (Illumination Intensity Value, Motion Value) |

LED DRIVING DEVICE AND LIGHTING DEVICE

CROSS-REFERENCE TO RELATED APPLICATIONS

This application claims priority to, and benefit of Korean Patent Application No. 10-2013-0099238 filed on Aug. 21, 2013, with the Korean Intellectual Property Office, the entire contents of which are hereby incorporated by reference.

TECHNICAL FIELD

The present disclosure relates to a light emitting diode (LED) driving device and a lighting device.

BACKGROUND

Light emitting diodes (LEDs) are commonly used as light sources due to various advantages thereof such as low power consumption, a high degree of luminance, and the like. In particular, recently, light emitting devices have been employed as backlights in lighting devices and large liquid crystal displays (LCDs). In general, light emitting devices are provided as packages that may be easily installed in various devices such as lighting devices, and the like. As LEDs are increasingly used for illumination in various fields, compatibility thereof to substitute existing lighting devices has emerged as an important issue.

SUMMARY

An aspect of the present disclosure relates to an LED driving device capable of applying an existing LED to facilities for operating existing lighting fixtures such as a fluorescent lamp, an incandescent lamp, or the like.

One aspect of the present disclosure encompasses an LED driving device including a first converter generating a first voltage, a second converter generating a second voltage for driving a plurality of light emitting diodes (LEDs) on the basis of the first voltage, and a control circuit connected to an output terminal of the first converter to control a level of the first voltage. The control circuit includes a cut-off circuit including a comparison circuit having hysteresis characteristics and a bleeder circuit.

The comparison circuit may compare an input signal generated on the basis of the first voltage with a predetermined reference signal.

The comparison circuit may include a Schmitt trigger circuit.

The reference signal may correspond to a minimum voltage to operate the plurality of LEDs.

When a level of the input signal becomes lower than a level of the reference signal, the comparison circuit may perform controlling to allow a current to flow to the bleeder circuit, and when the level of the input signal becomes higher than the level of the reference signal, the comparison circuit may perform controlling to cut off the current flowing into the bleeder circuit.

The bleeder circuit may include a switching element controlled by a signal outputted from the comparison circuit, and a bleeder resistor connected to the switching element. The bleeder resistor may deliver the first voltage to the second converter under initial driving (or start-up) conditions of the first converter in which the switching element is in a turned-off state.

The first converter may be a constant current converter, and the second converter may be a buck converter.

Another aspect of the present disclosure relates to a lighting device may include a light emitting unit including a plurality of light emitting diodes (LEDs), a converter unit including a first converter and a second converter connected in series and generating a driving voltage for operating the light emitting unit by using an alternating current (AC) input voltage, and a control circuit configured to control an operation of the second converter by comparing a first voltage output from the first converter with a predetermined reference signal. The control circuit includes a switching element receiving the first voltage through a resistor and controls turning-on and turning-off the switching element according to results of the comparison between the first voltage and the reference signal.

The switching element may include an input terminal receiving the first voltage through a bleeder resistor, and a control terminal receiving a control signal generated from the results of the comparison between the first voltage and the reference signal.

The control circuit may include a Schmitt trigger circuit receiving an input signal corresponding to the first voltage through an inverting terminal thereof and receiving the reference signal through a non-inverting terminal thereof.

When a level of the input signal becomes higher than a level of the reference signal, the Schmitt trigger circuit may turn off the switching element to cut off a current flowing in the bleeder resistor, and when the level of the input signal becomes lower than the level of the reference signal, the Schmitt trigger circuit may turn on the switching element to allow a current to flow to the bleeder resistor.

The bleeder resistor may deliver the first voltage to the second converter under initial driving conditions in which the switching element is in a turned-off state.

The first converter may be a constant current converter, and the second converter may be a buck converter.

Still another aspect of the present disclosure encompasses an LED driving device including a first converter generating a first voltage, a second converter generating a second voltage for driving a plurality of light emitting diodes (LEDs) on the basis of the first voltage, and a control circuit configured to control a level of the first voltage. The control circuit includes a switching element receiving the first voltage through a resistor and controls turning-on and turning-off the switching element according to results of the comparison between the first voltage and the reference signal.

The switching element may include an input terminal receiving the first voltage through a bleeder resistor, and a control terminal receiving a control signal generated from the results of the comparison between the first voltage and the reference signal.

The control circuit may include a Schmitt trigger circuit receiving an input signal corresponding to the first voltage through an inverting terminal thereof and receiving the reference signal through a non-inverting terminal thereof.

The bleeder resistor may deliver the first voltage to the second converter under initial driving conditions in which the switching element is in a turned-off state.

The first converter may be a constant current converter, and the second converter may be a buck converter.

BRIEF DESCRIPTION OF DRAWINGS

The above and other aspects, features and other advantages of the present disclosure will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
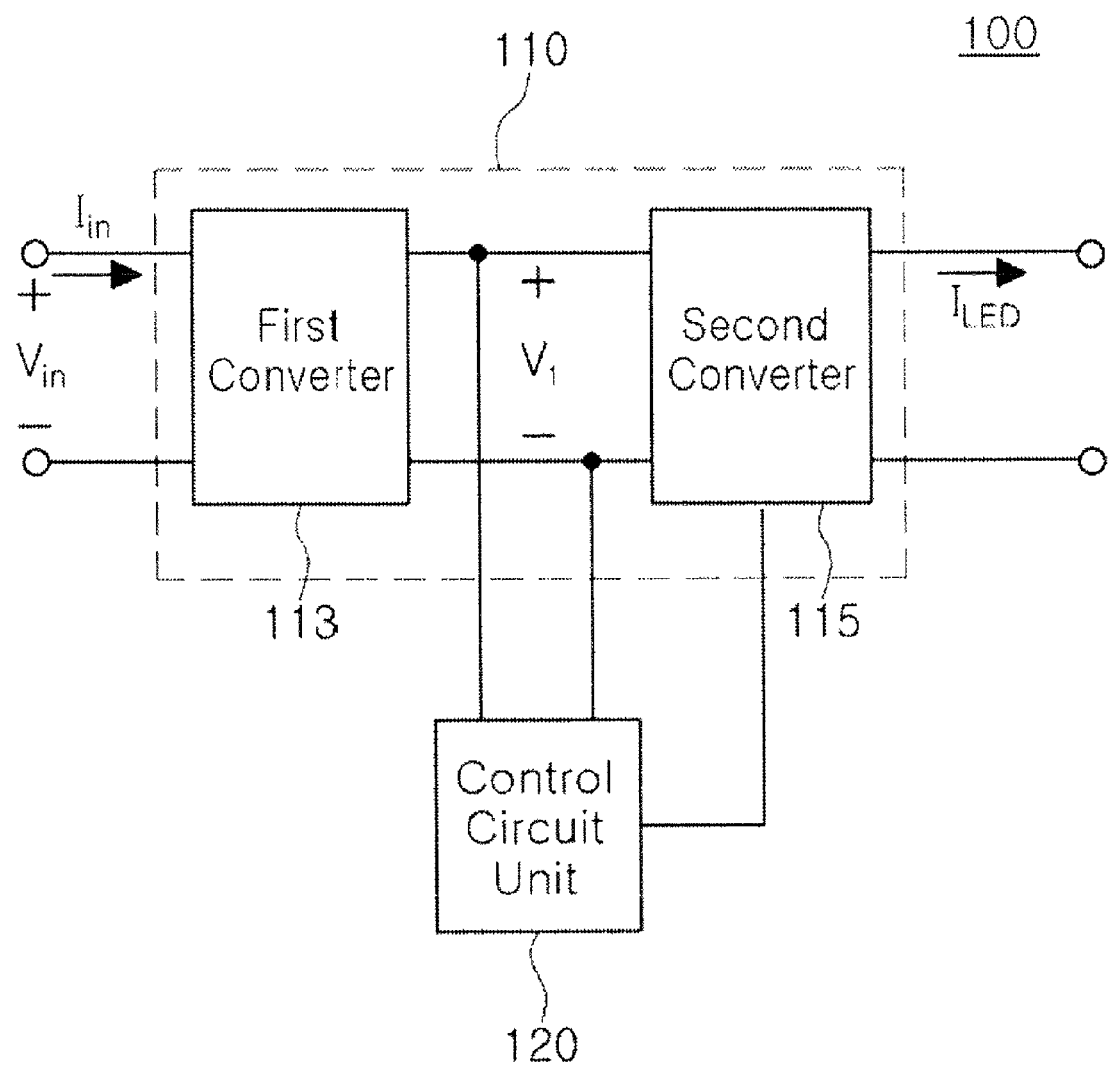
FIG. 1 is a block diagram schematically illustrating an LED driving device according to an embodiment of the present disclosure.

Hereinafter, embodiments of the present disclosure will be described in detail with reference to the accompanying drawings.

The present inventive concept may, however, be embodied in many different forms and should not be construed as being limited to the embodiments set forth herein. Rather, these embodiments are provided so that this disclosure will be thorough and complete, and will fully convey the scope of the present inventive concept to those skilled in the art. In the drawings, the shapes and dimensions of elements may be exaggerated for clarity, and the same reference numerals will be used throughout to designate the same or like components.

FIG. 1 is a block diagram schematically illustrating an LED driving device according to an embodiment of the present disclosure.

Referring to FIG. 1, an LED driving device 100 according to an embodiment of the present disclosure may include a first converter 113, a second converter 115 connected to the first converter 113 in series, and a control circuit 120. The first converter 113 and the second converter 115 may be included in a converter unit 110. One or more light emitting devices may be connected to an output terminal of the second converter 115, and the one or more light emitting devices may operate according to a current signal $I_{LED}$ outputted from the second converter 115. The one or more light emitting devices may be provided in the form of a package including LEDs.

In an embodiment of the present inventive concept, the first converter 113, which may be a constant current type converter, generates a voltage $V_1$ (see also FIG. 14) transmitted to the second converter 115 by using a voltage $V_{in}$ and a current $I_{in}$, applied to an input terminal. The voltage $V_{in}$ applied to the input terminal of the first converter 113 may be a DC voltage which has been rectified by a rectifier. In order to operate according to a constant current scheme, the first converter 113 may sense a level of the voltage $V_1$ at an output terminal thereof, and compare the level of the voltage $V_1$ with a predetermined reference voltage level to generate an appropriate compensation value.

Namely, in terms of the characteristics of the first converter 113 operating according to the constant current scheme, the level of the voltage $V_1$ transmitted to the input terminal of the second converter 115 may vary. A value of the current $I_{LED}$ operating one or more LEDs may be determined according to the level of the voltage $V_1$ input to the second converter 115. Thus, in order to secure a stable operation of the LEDs and regulate brightness of light output by a light emitting unit, the level of the voltage $V_1$ applied to the second converter 115 may be controlled within an appropriate range.

As for the relationship between the voltage $V_1$ and the output current $I_{LED}$, in order to turn on one or more LEDs to have desired brightness, the voltage $V_1$ may be controlled to be decreased when the output current $I_{LED}$ is increased, or controlled to be increased when the output current $I_{LED}$ is decreased. As a result, the level of the voltage $V_1$ may be varied according to the output current $I_{LED}$ of the second converter, i.e., a load of the second converter 115. Since one or more LEDs are connected to the output terminal of the second converter 115, the load of the second converter 115 may be determined according to characteristics of the one or more LEDs, heat generation, and the like.

Here, in order to allow the LEDs to operate effectively, a level of the voltage $V_1$ may be controlled to be within a predetermined reference range. The predetermined reference range for determining a level of the voltage $V_1$ to secure an effective operation of the LEDs may be defined by an upper limit reference voltage $V_{th1}$ in consideration of stress applied to the LED driving device 100 and the LEDs and a lower limit reference voltage $V_{th2}$ corresponding to a minimum voltage at which the second converter 115 may operate normally.

In an embodiment of the present disclosure, the second converter 115 may be a buck converter. Thus, in order for the second converter 115 to operate normally, the voltage $V_1$ having a level sufficiently high to store electric charges in a capacitor included in the second converter 115 may be inputted, and this voltage may be defined as the lower limit reference voltage $V_{th2}$.

When the voltage $V_1$ inputted to the second converter 115 has a level similar to the lower limit reference voltage $V_{th2}$ and is repeatedly increased or decreased irregularly due to a ripple component, the output current $I_{LED}$ of the second converter 115 may be repeatedly increased and decreased at a value similar to a minimum current level required for turning on the one or more LEDs. As a result, the LEDs may be repeatedly turned on and turned off to generate flickering, which may lead to an increase in stress applied to the LEDs, as well as a degradation of performance as a lighting fixture, to cause a problem such as a reduction in lifespan, and the like.

In an embodiment of the present inventive concept, the control circuit 120 may be connected between the first converter 113 and the second converter 115 and control an operation of the second converter 115 on the basis of a level of the voltage $V_1$, thus preventing a flickering phenomenon, or the like, from occurring in the LEDs. The control circuit 120 may include a comparison circuit for comparing a level of the voltage $V_1$ with a predetermined reference voltage, and a bleeder circuit. In this case, the comparison circuit may include a circuit using hysteresis characteristics. In an embodiment of the present disclosure, the comparison circuit may include a Schmitt trigger circuit.

The comparison circuit may generate an output signal by comparing a level of the voltage $V_1$ or a level of the input signal generated on the basis of the voltage $V_1$ with a predetermined reference signal, and the output signal may control an ON/OFF operation of a switching element included in the bleeder circuit. The switching element may be implemented as a field effect transistor (FET) in an embodiment of the present disclosure, and in this case, the signal output from the comparison circuit may be applied to a gate of the switching element and a bleeder resistor may be connected to a drain of the switching element.

When the level of the voltage $V_1$, or the level of the input signal generated on the basis of the voltage $V_1$ is reduced to be lower than a level of the reference signal, the comparison circuit may turn on the switching element such that a current is applied to the bleeder resistor. Conversely, when the level of the voltage $V_1$, or the level of the input signal generated on the basis of the voltage $V_1$ is increased to be higher than the level of the reference signal, the comparison circuit may turn off the switching element such that a current does not flow to the bleeder resistor. Accordingly, a flickering phenomenon occurring at a level similar to the voltage $V_{th2}$ due to a ripple component included in the voltage $V_1$, and the like, can be prevented.

Figure 2:
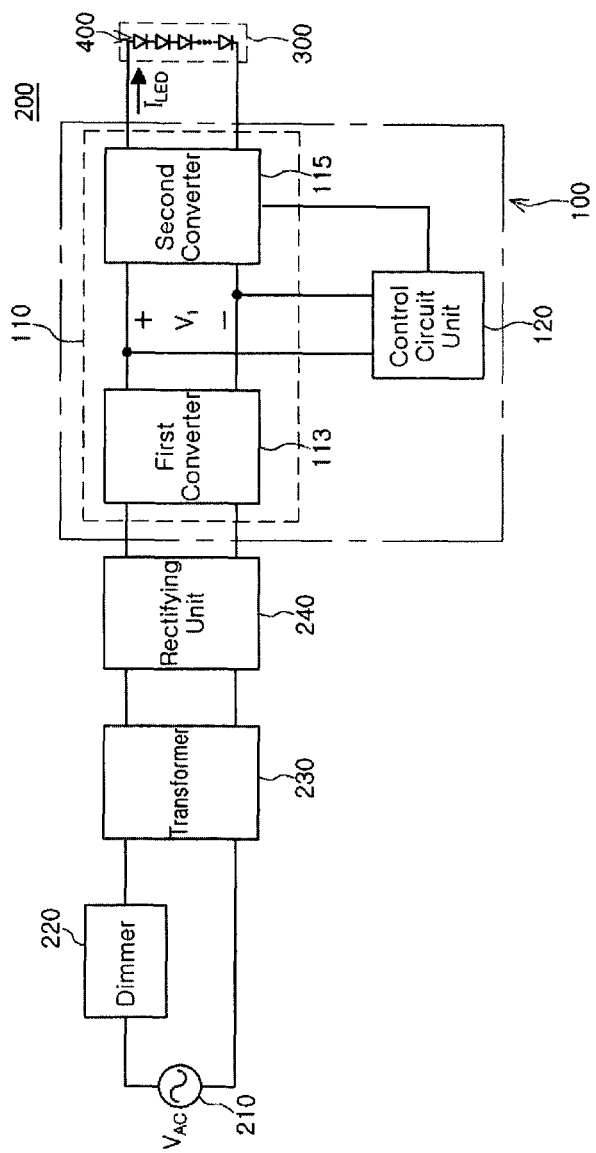
FIG. 2 is a schematic block diagram of a lighting device including an LED driving device according to an embodiment of the present disclosure.

FIG. 2 is a schematic block diagram of a lighting device including an LED driving device according to an embodiment of the present disclosure.

Referring to FIG. 2, a lighting device 200 according to an embodiment of the present disclosure may include the LED driving device 100. The LED driving device 100 may include the first converter 113, the second converter 115, and the control circuit 120, a light emitting unit 300, an alternating current (AC) power source 210, a dimmer 220, a transformer 230, a rectifier 240, and the like. The light emitting unit 300 may include a plurality of light emitting elements 400. Each of the plurality of light emitting elements 400 may be provided in the form of a package including an LED.

As described above with reference to FIG. 1, the first converter 113 and the second converter 115 may be connected in series, and the control circuit 120 may be connected between the first converter 113 and the second converter 115. The control circuit 120 may control an operation of the second converter 115 by sensing the level of the voltage $V_1$ outputted from the first converter 113 and inputted to the second converter 115.

In an embodiment of the present disclosure, the control circuit 120 may include a switching element receiving the voltage $V_1$ in an input terminal thereof through a resistor. The control circuit 120 may compare the level of the voltage $V_1$ with the level of the reference signal and control the switching element to be turned on or turned off according to the comparison results. In this case, it may be determined, according to turning-on and turning-off operations of the switching element, whether the voltage $V_1$ is input to the second converter 115. The control circuit 120 may control the operation of the light emitting unit 300 by controlling turning-on and turning-off operations of the switching element.

The AC power source 210 may be a general commercial AC power source. The dimmer 220, a device provided to allow a user to adjust luminance of light output from the light emitting unit 300, may be a trailing edge-type or a leading edge-type dimmer. The transformer 230 may be an electromagnetic or an externally excited transformer, which may step down a voltage of an AC signal which has passed through the dimmer 220, and output the same. The rectifier 240 may include a diode bridge, and the like. A direct current (DC) signal rectified through the rectifier 240 may be inputted to the first converter 113.

Meanwhile, the light emitting unit 300 illustrated in FIG. 2 may include a plurality of light emitting elements 400 and a substrate on which the plurality of light emitting elements 400 including LEDs are mounted. Hereinafter, various embodiments of the substrate and the light emitting elements 400 that may be included in the light emitting unit 300 will be described.

First, various embodiments of the substrate that may be included in the light emitting unit 300 will be described with reference to FIGS. 3 through 9.

Figure 3:
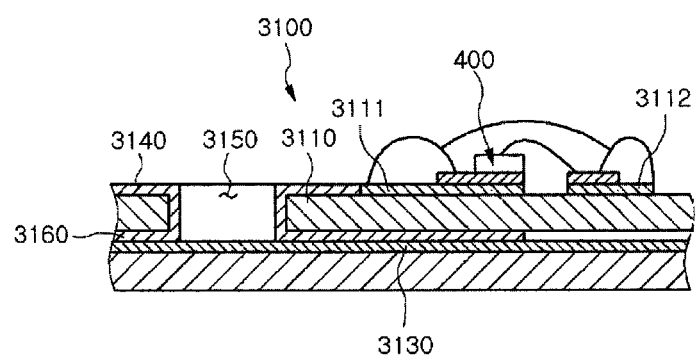
FIG. 3 is a cross-sectional view schematically illustrating an example of a substrate employable in the light emitting unit of FIG. 1.

As illustrated in FIG. 3, a substrate 3100 may include an insulating substrate 3110 including predetermined circuit patterns 3111 and 3112 formed on one surface thereof, an upper thermal diffusion plate 3140 formed on the insulating substrate 3110 such that the upper thermal diffusion plate 3140 is in contact with at least one of the circuit patterns 3111 and 3112 so as to dissipate heat generated by the light emitting elements 400, and a lower thermal diffusion plate 3160 formed on the other surface of the insulating substrate 3110 to transmit heat, transmitted from the upper thermal diffusion plate 3140, outwardly. The upper thermal diffusion plate 3140 and the lower thermal diffusion plate 3160 may be connected by at least one through hole 3150. The at least one through hole 3150 may penetrate through the insulating substrate 3110 and have plated inner walls, so as to conduct heat therebetween.

In the insulating substrate 3110, the circuit patterns 3111 and 3112 may be formed by cladding a ceramic with copper or epoxy resin-based FR4 and performing an etching process thereon. An insulating thin film 3130 may be formed by coating an insulating material on a lower surface of the substrate 3110.

Figure 4:
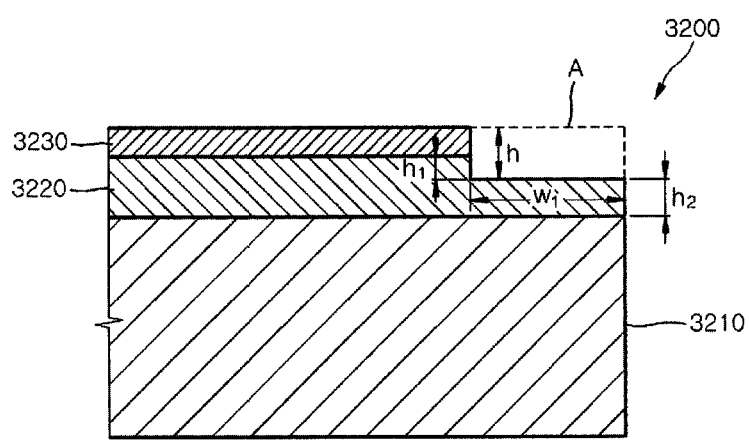
FIG. 4 is a cross-sectional view schematically illustrating another example of the substrate according to an embodiment of the present disclosure.

FIG. 4 illustrates another example of a substrate. As illustrated in FIG. 4, a substrate 3200 may include a first metal layer 3210, an insulating layer 3220 formed on the first metal layer 3210, and a second metal layer 3230 formed on the insulating layer 3220. A step region 'A' allowing the insulating layer 3220 to be exposed may be formed in at least one end portion of the substrate 3200.

The first metal layer 3210 may be made of a material having excellent exothermic characteristics. For example, the first metal layer 3210 may be made of a metal such as aluminum (Al), iron (Fe), or the like, or an alloy thereof. The first metal layer 3210 may have a unilayer structure or a multilayer structure. The insulating layer 3220 may be made of a material having insulating properties, and may be formed with an inorganic material or an organic material. For example, the insulating layer 3220 may be made of an epoxy-based insulating resin, and may include metal powder such as aluminum (Al) powder, or the like, in order to enhance thermal conductivity. The second metal layer 3230 may generally be formed of a copper (Cu) thin film.

As illustrated in FIG. 4, in the metal substrate according to an embodiment of the present inventive concept, a length of an exposed region at one end portion of the insulating layer 3220, i.e., an insulation length, may be greater than a thickness of the insulating layer 3220. Here, the insulation length refers to a length of the exposed region of the insulating layer 3220 between the first metal layer 3210 and the second metal layer 3230. When the metal substrate 3200 is viewed from above, a width of the exposed region of the insulating layer 3220 is an exposure width W1. The region 'A' in FIG. 4 may be removed through a grinding process, or the like, during the manufacturing process of the metal substrate. The region as deep as a depth 'h' downwardly from a surface of the second metal layer 3230 may be removed to expose the insulating layer 3220 by the exposure width W1, forming a step structure in which the depth of a removed portion of the insulating layer 3220 is h1 and the depth of the remaining portion of the insulating layer 3220 is h2. If the end portion of the metal substrate 3200 is not removed, the insulation length may be equal to a thickness (h1+h2) of the insulating layer 3220, and by removing a portion of the end portion of the metal substrate 3200, the insulation length equal to approximately W1 may be additionally secured. Thus, when a withstand voltage of the metal substrate 3200 is tested, the likelihood of contact between the two metal layers 3210 and 3230 in the end portions thereof is minimized.

Figure 5:
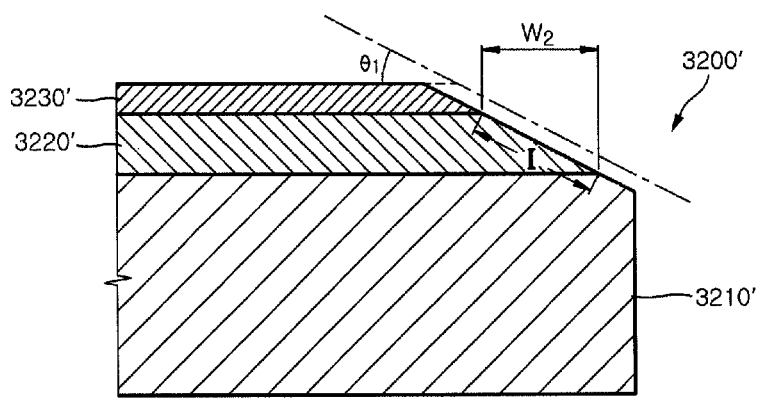
FIG. 5 is a cross-sectional view schematically illustrating a modification of the substrate of FIG. 4.

FIG. 5 is a view schematically illustrating a structure of a metal substrate according to a modification of FIG. 4. Referring to FIG. 5, a metal substrate 3200' may include a first metal layer 3210', an insulating layer 3220' formed on the first metal layer 3210', and a second metal layer 3230' formed on the insulating layer 3220'. The insulating layer 3220' and the second metal layer 3230' may include regions removed at a predetermined tilt angle θ1, and the first metal layer 3210' may also include a region removed at the predetermined tilt angle θ1.

Here, the tilt angle θ1 may be an angle between an interface between the insulating layer 3220' and the second metal layer 3230' and an end portion of the insulating layer 3220'. The tilt angle θ1 may be selected to secure a desired insulation length I in consideration of a thickness of the insulating layer 3220'. The tile angle θ1 may be selected from within the range of 0<θ1<90 (degrees). As the tilt angle θ1 is increased, the insulation length I and a width W2 of the exposed region of the insulating layer 3220' is decreased, so in order to secure a larger insulation length, the tilt angle θ1 may be selected to be smaller. For example, the tilt angle may be selected from within the range of 0<θ1≤45 (degrees) to secure a larger insulation length.

Figure 6:
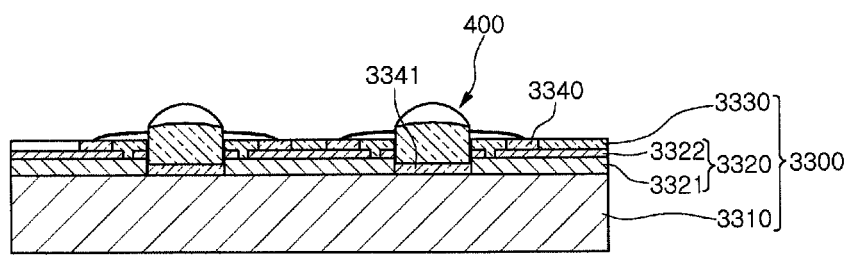
FIGS. 6 through 9 are cross-sectional views schematically illustrating various examples of the substrate according to embodiments of the present disclosure.

FIG. 6 schematically illustrates another example of a substrate. Referring to FIG. 6, a substrate 3300 may include a metal support substrate 3310 and resin-coated copper (RCC) 3320 formed on the metal support substrate 3310. The RCC 3320 may include an insulating layer 3321 and a copper foil 3322 laminated on the insulating layer 3321. A portion of the RCC 3320 may be removed to form at least one recess in which the light emitting element 400 may be installed. The metal substrate 3300 may have a structure in which the RCC 3320 is removed from a lower region of the light emitting element 400 and the light emitting element 400 is in direct contact with the metal support substrate 3310. Thus, heat generated by the light emitting element 400 may be directly transmitted to the metal support substrate 3310, enhancing heat dissipation performance. The light emitting element 400 may be electrically connected to be fixed through solders 3340 and 3341. A protective layer 3330 made of a liquid photo solder resist (PSR) may be formed on an upper portion of the copper foil 3322.

Figure 7:
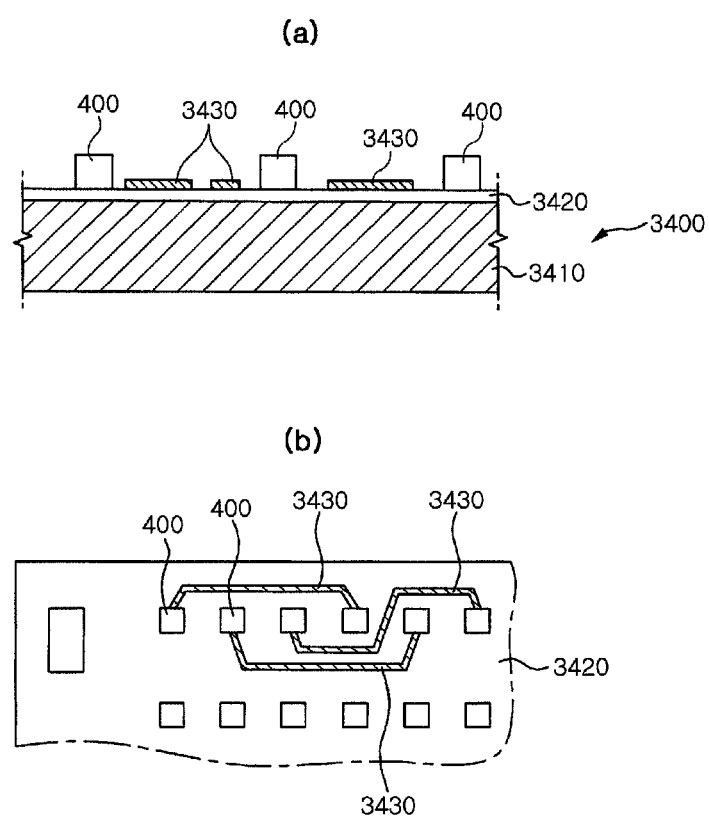

FIG. 7 schematically illustrates a cross-section view (see FIG. 7(a)) and a plan view (see FIG. 7(b)) of another example of the substrate. A substrate according to an embodiment of the present inventive concept may include an anodized metal substrate having excellent heat dissipation characteristics and incurring low manufacturing costs. Referring to FIG. 7, the anodized metal substrate 3400 may include a metal plate 3410, an anodic oxide film 3420 formed on the metal plate 3410, and electrical wirings 3430 formed on the anodic oxide film 3420.

The metal plate 3410 may be made of aluminum (Al) or an Al alloy that may be easily obtained at low cost. Besides, the metal plate 3410 may be made of any other anodizable metal, for example, a material such as titanium (Ti), magnesium (Mg), or the like.

Aluminum oxide film ($Al_2O_3$) 3420 obtained by anodizing aluminum may have a relatively high heat transmission characteristics ranging from about 10 W/mK to 30 W/mK. Thus, the anodized metal substrate 3400 has superior heat dissipation characteristics to those of a printed circuit board (PCB), a metal core PCB (MCPCB), or the like, conventional polymer substrates.

Figure 8:
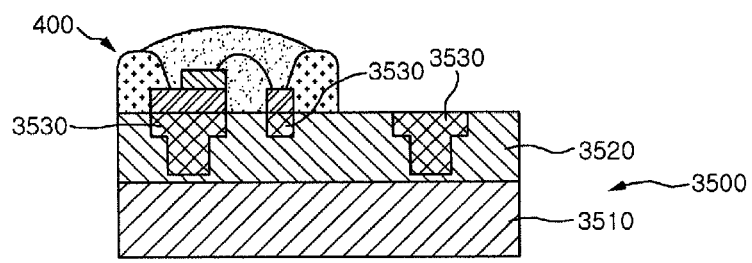

FIG. 8 schematically illustrates another example of the substrate. As illustrated in FIG. 8, a substrate 3500 may include a metal substrate 3510, an insulating resin 3520 coated on the metal substrate 3510, and a circuit pattern 3530 formed on the insulating resin 3520. Here, the insulating resin 3520 may have a thickness equal to or less than 200 μm. The insulating resin 3520 may be laminated on the metal substrate 3510 in the form of a solid film or may be coated in liquid form using spin coating or a blade. Also, the circuit pattern 3530 may be formed by filling a metal such as copper (Cu), or the like, in a circuit pattern intaglioed on the insulting layer 3520. The light emitting element 400 may be mounted to be electrically connected to the circuit pattern 3530.

Figure 9:
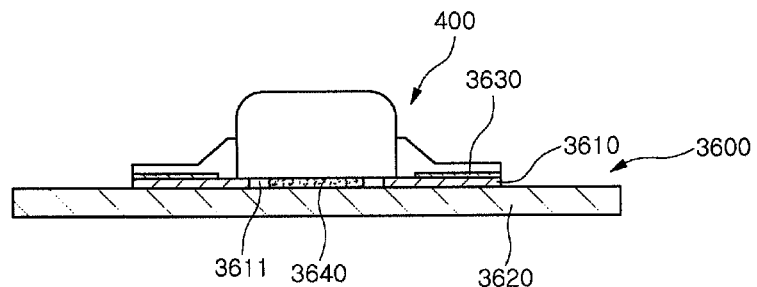

Meanwhile, the substrate may include a flexible PCB (FPCB) that can be freely deformed. As illustrated in FIG. 9, a substrate 3600 may include a flexible circuit board 3610 having one or more through holes 3611, and a support substrate 3620 on which the flexible circuit board 3610 is mounted. A heat dissipation adhesive 3640 may be provided in the through hole 3611 to couple a lower surface of the light emitting element 400 and an upper surface of the support substrate 3620. Here, the lower surface of the light emitting element 400 may be a lower surface of a chip package, a lower surface of a lead frame having an upper surface on which a chip is mounted, or a metal block. A circuit wiring 3630 may be formed on the flexible circuit board 3610 and electrically connected to the light emitting element 400.

In this manner, since the flexible circuit board 3610 is used, thickness and weight can be reduced, obtaining reduced thickness and weight and reducing manufacturing costs. Since the light emitting element 400 is directly bonded to the support substrate 3620 by the heat dissipation adhesive 3640, heat dissipation efficiency in dissipating heat generated by the light emitting element 400 can be increased.

Hereinafter, various LED packages and various LED chips as light emitting devices employable in the light source module according to an embodiment of the present inventive concept will be described.

<Light Emitting Device—First Example>

Figure 10:
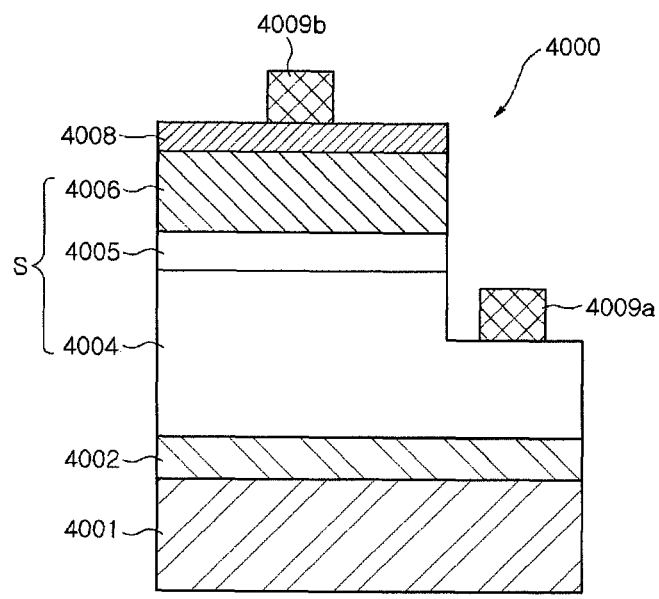
FIG. 10 is a cross-sectional view schematically illustrating an example of a light emitting device (or an LED) employable in the light emitting unit of FIG. 1.

FIG. 10 is a side cross-sectional view schematically illustrating an example of a light emitting device (an LED chip).

As illustrated in FIG. 10, a light emitting element 4000 may include a light emitting laminate S formed on a growth substrate 4001. The light emitting laminate S may include a first conductivity-type semiconductor layer 4004, an active layer 4005, and a second conductivity-type semiconductor layer 4006.

An ohmic-contact layer 4008 may be formed on the second conductivity-type semiconductor layer 4006, and first and second electrodes 4009a and 4009b may be formed on upper surfaces of the first conductivity-type semiconductor layer 4004 and the ohmic-contact layer 4008, respectively.

In the present disclosure, terms such as 'upper portion', 'upper surface', 'lower portion', 'lower surface', 'lateral surface', and the like, are determined based on the drawings, and in actuality, the terms may be changed according to a direction in which a light emitting device is disposed.

Hereinafter, major components of the light emitting device will be described.

[Substrate]

A substrate constituting a light emitting device may be a growth substrate for epitaxial growth. As the substrate 4001, an insulating substrate, a conductive substrate, or a semiconductor substrate may be used as necessary. For example, sapphire, SiC, Si, $MgAl_2O_4$, MgO, $LiAlO_2$, $LiGaO_2$, or GaN may be used as a material of the substrate 4001. For epitaxial growth of a GaN material, a GaN substrate, a homogeneous substrate, may be desirable, but may incur high production costs due to difficulties in the manufacturing thereof.

As a heterogeneous substrate, a sapphire substrate, a silicon carbide substrate, or the like, is largely used, and in this case, a sapphire substrate is utilized relatively more than the costly silicon carbide substrate. When a heterogeneous substrate is used, defects such as dislocation, and the like, may be increased due to differences in lattice constants between a substrate material and a thin film material. Also, differences in coefficients of thermal expansion between the substrate material and the thin film material may cause bowing due to changing temperatures, and the bowing may cause cracks in the thin film. This problem may be reduced by using a buffer layer 4002 between the substrate 4001 and the light emitting laminate S based on GaN.

The substrate 4001 may be fully or partially removed or patterned during a chip manufacturing process in order to enhance optical or electrical characteristics of the LED chip before or after the light emitting laminate S is grown.

For example, a sapphire substrate may be separated by irradiating a laser on the interface between the substrate and a semiconductor layer through the substrate, and a silicon substrate or a silicon carbide substrate may be removed through a method such as polishing, etching, or the like.

In removing the substrate, a support substrate may be used, and in this case, in order to enhance luminance efficiency of an LED chip on the opposite side of the original growth substrate, the support substrate may be bonded by using a reflective metal or a reflective structure may be inserted into the center of a junction layer.

Substrate patterning may form a concavo-convex surface or a sloped surface on a main surface (one surface or both surfaces) or lateral surfaces of a substrate before or after the growth of the light emitting laminate S, enhancing light extraction efficiency. A pattern size may be selected within the range from 5 nm to 500 μm. The substrate may have any structure as long as it has a regular or irregular pattern to enhance light extraction efficiency. The substrate may have various shapes such as a columnar shape, a peaked shape, a hemispherical shape, a polygonal shape, and the like.

Here, the sapphire substrate is a crystal having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures, so the sapphire substrate is commonly used as a nitride growth substrate.

The substrate 4001 may also be made of silicon (Si). Since a silicon (Si) substrate is more appropriate for increasing a diameter and is relatively low in price, it may be used to facilitate mass-production. Here, a difference in lattice constants between the silicon substrate having (111) plane as a substrate surface and GaN is approximately 17%. Therefore, a technique of suppressing the generation of crystal defects due to the difference between the lattice constants may be required. Also, a difference in coefficients of thermal expansion between silicon and GaN is approximately 56%, requiring a technique of suppressing bowing of a wafer generated due to the difference in the coefficients of thermal expansion. Bowed wafers may result in cracks in the GaN thin film and make it difficult to control processes to increase dispersion of emission wavelengths (or excitation wavelengths) of light in the same wafer, or the like.

The silicon substrate absorbs light generated in the GaN-based semiconductor, lowering external quantum yield of the light emitting device. Thus, the substrate may be removed and a support substrate such as a silicon substrate, a germanium substrate, an SiAl substrate, a ceramic substrate, a metal substrate, or the like, including a reflective layer may be additionally formed to be used, as necessary.

[Buffer Layer]

When a GaN thin film is grown on a heterogeneous substrate such as the silicon substrate, dislocation density may be increased due to a lattice constant mismatch between a substrate material and a thin film material, and cracks and warpage (or bowing) may be generated due to a difference between coefficients of thermal expansion. In order to prevent dislocation of and cracks in the light emitting laminate S, the buffer layer 4002 may be disposed between the substrate 1001 and the light emitting laminate S. The buffer layer 1002 may serve to adjust a degree of warpage of the substrate when an active layer is grown, to reduce a wavelength dispersion of a wafer.

The buffer layer 4002 may be made of $Al_xIn_yGa_{1-x-y}N$ ($0 \leq x \leq 1$, $0 \leq y \leq 1$, $0 \leq x+y \leq 1$), in particular, GaN, AlN, AlGaN, InGaN, or InGaNAlN, and a material such as $ZrB_2$, $HfB_2$, ZrN, HfN, TiN, or the like, may also be used as necessary. Also, the buffer layer may be formed by combining a plurality of layers or by gradually changing a composition.

A silicon (Si) substrate has a coefficient of thermal expansion significantly different from that of GaN. Thus, in the case of growing a GaN-based thin film on the silicon substrate, when a GaN thin film is grown at a high temperature and is subsequently cooled to room temperature, tensile stress is applied to the GaN thin film due to the difference in the coefficients of thermal expansion between the silicon substrate and the GaN thin film, generating cracks. In this case, in order to prevent the generation of cracks, a method of growing the GaN thin film such that compressive stress is applied to the GaN thin film while the GaN thin film is being grown is used to compensate for tensile stress.

A difference in the lattice constants between silicon (Si) and GaN involves a high possibility of a defect being generated therein. In the case of a silicon substrate, a buffer layer having a composite structure may be used in order to control stress for restraining warpage (or bowing) as well as controlling a defect.

For example, first, an AlN layer may be formed on the substrate 4001. In this case, a material not including gallium (Ga) may be used in order to prevent a reaction between silicon (Si) and gallium (Ga). Besides AlN, a material such as SiC, or the like, may also be used. The AlN layer is grown at a temperature ranging from 400° C. to 1,300° C. by using an aluminum (Al) source and a nitrogen (N) source. An AlGaN intermediate layer may be inserted into the center of GaN between the plurality of AlN layers to control stress, as necessary.

[Light Emitting Laminate]

The light emitting laminate S having a multilayer structure of a Group III nitride semiconductor will be described in detail. The first and second conductivity-type semiconductor layers 4004 and 4006 may be formed of n-type and p-type impurity-doped semiconductor materials, respectively.

However, the present inventive concept is not limited thereto and, the first and second conductivity-type semiconductor layers 4004 and 4006 may be formed of p-type and n-type impurity-doped semiconductor materials, respectively. For example, the first and second conductivity-type semiconductor layers 4004 and 4006 may be made of a Group III nitride semiconductor, e.g., a material having a composition of $Al_xIn_yGa_{1-x-y}N$ ($0 \leq x \leq 1$, $0 \leq y \leq 1$, $0 \leq x+y \leq 1$). Of course, the present inventive concept is not limited thereto and the first and second conductivity-type semiconductor layers 4004 and 4006 may also be made of a material such as an AlGaInP-based semiconductor or an AlGaAs-based semiconductor.

Meanwhile, the first and second conductivity-type semiconductor layers 4004 and 4006 may have a unilayer structure, or, alternatively, the first and second conductivity-type semiconductor layers 4004 and 4006 may have a multilayer structure including layers having different compositions, thicknesses, and the like, as necessary. For example, the first and second conductivity-type semiconductor layers 4004 and 4006 may have a carrier injection layer for improving electron and hole injection efficiency, or may have various types of superlattice structure, respectively.

The first conductivity-type semiconductor layer 4004 may further include a current spreading layer (not shown) in a region adjacent to the active layer 4005. The current spreading layer may have a structure in which a plurality of $In_xAl_yGa_{(1-x-y)}N$ layers having different compositions or different impurity contents are iteratively laminated or may have an insulating material layer partially formed therein.

The second conductivity-type semiconductor layer 4006 may further include an electron blocking layer in a region adjacent to the active layer 4005. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer may have a bandgap wider than a bandgap of the active layer 4005, thus preventing electrons from being transferred via the second conductivity-type (e.g., p-type) semiconductor layer 4006.

The light emitting laminate S may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (ammonia ($NH_3$), or the like) may be supplied to a reaction container in which the substrate 4001 is installed as reactive gases, the substrate being maintained at a high temperature ranging from 900° C. to 1,100° C., and while a gallium nitride-based compound semiconductor is being grown, an impurity gas may be supplied as necessary to laminate the gallium nitride-based compound semiconductor as an undoped n-type or p-type semiconductor. Silicon (Si) is a well known n-type impurity. P-type impurity includes zinc (Zn), cadmium (Cd), beryllium (Be), magnesium (Mg), calcium (Ca), barium (Ba), and the like. Among these, magnesium (Mg) and zinc (Zn) may be mainly used.

Also, the active layer 4005 disposed between the first and second conductivity-type semiconductor layers 4004 and 4006 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used.

[Ohmic-Contact Layer and First and Second Electrodes]

The ohmic-contact layer 4008 may have a relatively high impurity concentration to have low ohmic-contact resistance to lower an operating voltage of the element and enhance element characteristics. The ohmic-contact layer 4008 may be formed of a GaN layer, a InGaN layer, a ZnO layer, or a graphene layer.

The first or second electrode 4009a or 4009b may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like.

The LED chip illustrated in FIG. 10 may have a structure in which first and second electrodes (e.g., 4009a and 4009b) face the same surface as a light extraction surface, but it may also be implemented to have various other structures, such as a flipchip structure in which first and second electrodes face a surface opposite to a light extraction surface, a vertical structure in which first and second electrodes are formed on mutually opposing surfaces, a vertical and horizontal structure employing an electrode structure by forming several vias in a chip as a structure for enhancing current spreading efficiency and heat dissipation efficiency, and the like.

<Light Emitting Device—Second Example>

Figure 11:
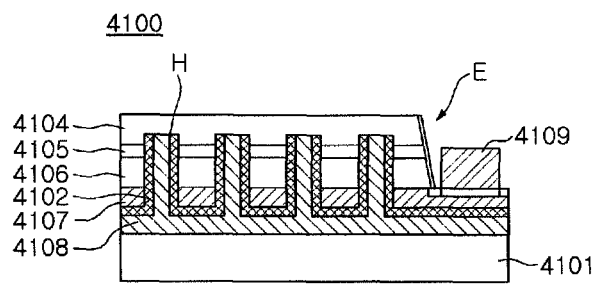
FIG. 11 is a cross-sectional view schematically illustrating another example of a light emitting device (or an LED) employable in the light emitting unit of FIG. 1.

In case of manufacturing a large light emitting device for a high output, an LED chip illustrated in FIG. 11 having a structure enhancing current spreading efficiency and heat dissipation efficiency may be provided.

As illustrated in FIG. 11, the LED chip 4100 may include a first conductivity-type semiconductor layer 4104, an active layer 4105, a second conductivity-type semiconductor layer 4106, a second electrode layer 4107, an insulating layer 4102, a first electrode 4108, and a substrate 4101, laminated sequentially. Here, in order to be electrically connected to the first conductivity-type semiconductor layer 4104, the first electrode layer 4108 may include one or more contact holes H extending from one surface of the first electrode layer 4108 to at least a partial region of the first conductivity-type semiconductor layer 4104. The first electrode layer 4108 may be electrically insulated from the second conductivity-type semiconductor layer 4106 and the active layer 4105. However, the first electrode layer 4108 is not an essential element in embodiments of the present inventive concept.

The contact hole H may extend from an interface of the first electrode layer 4108, passing through the second electrode layer 4107, the second conductivity-type semiconductor layer 4106, and the first active layer 4105, to the interior of the first conductivity-type semiconductor layer 4104. The contact hole H may extend at least to an interface between the active layer 4105 and the first conductivity-type semiconductor layer 4104, and preferably, extend to a portion of the first conductivity-type semiconductor layer 4104. However, the contact hole H may be formed for electrical connectivity and current spreading, so the purpose of the presence of the contact hole H is achieved when it is in contact with the first conductivity-type semiconductor layer 4104. Thus, it is not necessary for the contact hole H to extend to an external surface of the first conductivity-type semiconductor layer 4104.

The second electrode layer 4107 formed on the second conductivity-type semiconductor layer 4106 may be selectively made of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, in consideration of a light reflecting function and an ohmic-contact function with the second conductivity-type semiconductor layer 4106, and may be formed by using a process such as sputtering, deposition, or the like.

The contact hole H may have a form penetrating the second electrode layer 4107, the second conductivity-type semiconductor layer 4106, and the active layer 4105 so as to be connected to the first conductivity-type semiconductor layer 4104. The contact hole H may be formed through an etching process, e.g., inductively coupled plasma-reactive ion etching (ICP-RIE), or the like.

The insulating layer 4102 may be formed to cover a side wall of the contact hole H and a lower surface of the second electrode layer 4107. In this case, at least a portion of the first conductivity-type semiconductor layer 4104 may be exposed by the contact hole H. The insulating layer 4102 may be formed by depositing an insulating material such as $SiO_2$, $SiO_xN_y$, or $Si_xN_y$. The insulating layer 4102 may be deposited to have a thickness ranging from about 0.01 μm to 3 μm at a temperature equal to or lower than 500° C. through a chemical vapor deposition (CVD) process.

The first electrode layer 4108 including a conductive via formed by filling a conductive material may be formed within the contact hole H. A plurality of conductive vias may be formed in a single light emitting device region. The amount of vias and contact areas thereof may be adjusted such that the area of the plurality of vias occupying on the plane of the regions in which they are in contact with the first conductivity-type semiconductor layer 4104 ranges from 1% to 5% of the area of the light emitting device region. A radius of the via on the plane of the region in which the vias are in contact with the first conductivity-type semiconductor layer 4104 may range, for example, from 5 μm to 50 μm, and the number of vias may be 1 to 50 per light emitting device region according to a width of the light emitting device region. Although different according to a width of the light emitting device region, three or more vias may be provided. A distance between the vias may range from 100 μm to 500 μm, and the vias may have a matrix structure including rows and columns. Preferably, the distance between the vias may range from 150 μm to 450 μm. If the distance between the vias is smaller than 100 μm, the amount of vias may be increased to relatively reduce a light emitting area to lower luminous efficiency, and if the distance between the vias is greater than 500 μm, current spreading may suffer degradation of luminous efficiency. A depth of the contact hole H may range from 0.5 μm to 5.0 μm, although the depth of the contact hole H may vary according to a thickness of the second conductivity-type semiconductor layer and the active layer.

Subsequently, the substrate 4101 may be formed on the first electrode layer 4108. In this structure, the substrate 4101 may be electrically connected by the conductive via connected to the first conductivity-type semiconductor layer 4104.

The substrate 4101 may be made of a material including any one of Au, Ni, Al, Cu, W, Si, Se, GaAs, SiAl, Ge, SiC, AlN, $Al_2O_3$, GaN, AlGaN and may be formed through a process such as plating, sputtering, deposition, bonding, or the like.

In order to reduce contact resistance, the amount, a shape, a pitch, a contact area with the first and second conductivity-type semiconductor layers 4104 and 4106, and the like, of the contact hole H may be appropriately regulated. The contact holes H may be arranged to have various shapes in rows and columns to improve a current flow. Here, the second electrode layer 4107 may have one or more exposed regions in the interface between the second electrode layer 4107 and the second conductivity-type semiconductor layer 4106, i.e., an exposed region E. An electrode pad part 4109 connecting an external power source to the second electrode layer 4107 may be provided on the exposed region E.

In this manner, the LED chip 4100 illustrated in FIG. 11 may include the light emitting structure having the first and second main surfaces opposing one another and having the first and second conductivity-type semiconductor layers 4104 and 4106 providing the first and second main surfaces, respectively, and the active layer 4105 formed therebetween, the contact holes H connected to a region of the first conductivity-type semiconductor layer 4104 through the active layer 4105 from the second main surface, the first electrode layer 4108 formed on the second main surface of the light emitting structure and connected to a region of the first conductivity-type semiconductor layer 4104 through the contact holes H, and the second electrode layer 4107 formed on the second main surface of the light emitting structure and connected to the second conductivity-type semiconductor layer 4106.

Here, any one of the first and second electrodes 4108 and 4107 may be drawn out in a lateral direction of the light emitting structure.

<Light Emitting Device—Third Example>

A lighting device using an LED provides improved heat dissipation characteristics, but in the aspect of overall heat dissipation performance, preferably, the lighting device employs an LED chip having a low heating value. As an LED chip satisfying such requirements, an LED chip including a nano-structure (hereinafter, referred to as a 'nano-LED chip') may be used.

Such a nano-LED chip may include a recently developed core/shell type nano-LED chip, which has a low binding density to generate a relatively low degree of heat, has increased luminous efficiency by increasing a light emitting region by utilizing nano-structures, and prevent a degradation of efficiency due to polarization by obtaining a non-polar active layer, thus improving droop characteristics.

Figure 12:
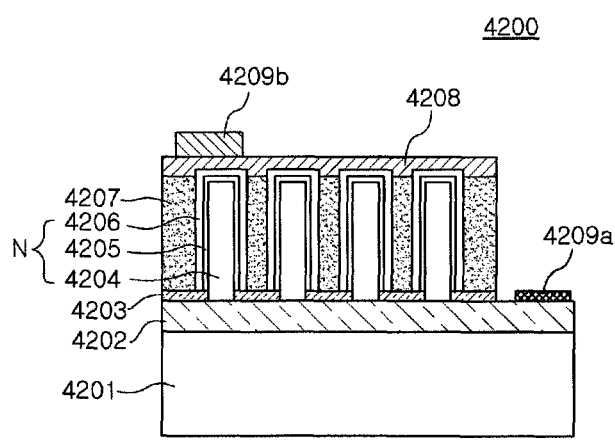
FIG. 12 is a cross-sectional view schematically illustrating another example of a light emitting device (or an LED) employable in the light emitting unit of FIG. 1.

FIG. 12 is a cross-sectional view illustrating a nano-LED chip as another example of an LED chip that may be employed in a light source module.

As illustrated in FIG. 12, a nano-LED chip 4200 may include a plurality of nano-light emitting structures N formed on a substrate 4201. In this example, it is illustrated that the nano-light emitting structures N have a core-shell structure as a rod structure, but the present inventive concept is not limited thereto and the nano-light emitting structures N may have a different structure such as a pyramid structure.

The nano-LED chip 4200 may include a base layer 4202 formed on the substrate 4201. The base layer 4202 may be a layer providing a growth surface for the nano-light emitting structure, which may be a first conductivity-type semiconductor layer. A mask layer 4203 having an open area for the growth of the nano-light emitting structures N (in particular, the core) may be formed on the base layer 4202. The mask layer 4203 may be made of a dielectric material such as $SiO_2$ or SiNx.

In the nano-light emitting structures N, a first conductivity-type nano-core 4204 may be formed by selectively growing a first conductivity-type semiconductor by using the mask layer 4203 having an open area. An active layer 4205 and a second conductivity-type semiconductor layer 4206 may be formed as shell layers on a surface of the nano core 4204. Accordingly, the nano-light emitting structures N may have a core-shell structure in which the first conductivity-type semiconductor is the nano core and the active layer 4205 and the second conductivity-type semiconductor layer 4206 enclosing the nano core are shell layers.

The nano-LED chip 4200 according to an embodiment of the present inventive concept may include a filler material 4207 filling spaces between the nano-light emitting structures N. The filler material 4207 may structurally stabilize the nano-light emitting structures N and may be employed as necessary in order to optically improve the nano-light emitting structures N. The filler material 4207 may be made of a transparent material such as $SiO_2$, or the like, but the present inventive concept is not limited thereto. An ohmic-contact layer 4208 may be formed on the nano-light emitting structures and connected to the second conductivity-type semiconductor layer 4206. The nano-LED chip 4200 may include first and second electrodes 4209a and 4209b connected to the base layer 4202 formed of the first conductivity-type semiconductor and the ohmic-contact layer 4208, respectively.

By forming the nano-light emitting structures such that they have different diameters, components, and doping densities, light having two or more different wavelengths may be emitted from the single device. By appropriately adjusting light having different wavelengths, white light may be implemented without using phosphors in the single device. Light having various desired colors or white light having different color temperatures may be implemented by combining a different LED chip with the foregoing device or combining wavelength conversion materials such as phosphors.

<Light Emitting Device—Fourth Example>

Figure 13:
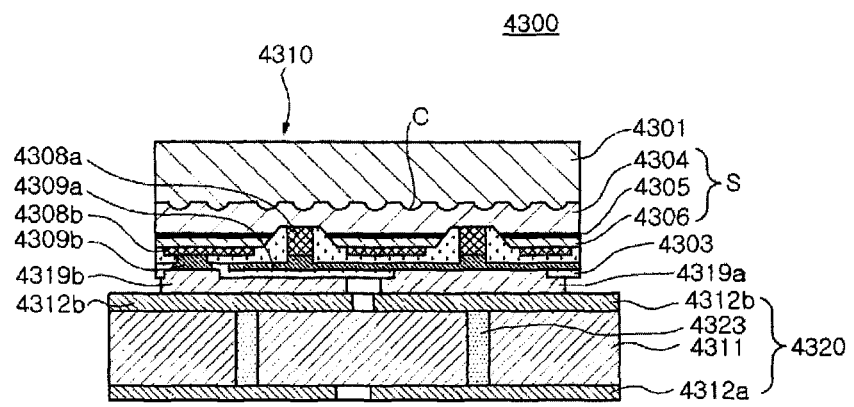
FIG. 13 is a cross-sectional view illustrating an example of an LED chip as a light emitting device employable in the light source module of FIG. 1, mounted on a mounting board.

FIG. 13 illustrates a semiconductor light emitting device 4300 having an LED chip 4310 mounted on a mounting substrate 4320 as a light source that may be employed in the foregoing lighting device.

The semiconductor light emitting device 2300 illustrated in FIG. 13 includes an LED chip 4310 mounted on a mounting substrate 4320.

The LED chip 4310 may include a light emitting laminate S disposed in one surface of the substrate 4301 and first and second electrodes 4308a and 4308b disposed on the opposite side of the substrate 4301 based on the light emitting laminate S. Also, the LED chip 4310 may include an insulating part 4303 covering the first and second electrodes 4308a and 4308b.

The first and second electrodes 4308a and 4308b may include first and second electrode pads 4319a and 4319b connected thereto by electrical connection parts 4309a and 4309b, respectively.

The light emitting laminate S may include a first conductivity-type semiconductor layer 4304, an active layer 4305, and a second conductivity-type semiconductor layer 4306. The first electrode 4308a may be provided as a conductive via connected to the first conductivity-type semiconductor layer 4304 through the second conductivity-type semiconductor layer 4306 and the active layer 4305. The second electrode 4308b may be connected to the second conductivity-type semiconductor layer 4306.

A plurality of conductive vias may be formed in a single light emitting device region. The amount of vias and contact areas thereof may be adjusted such that the area of the plurality of vias occupying on the plane of the regions in which they are in contact with the first conductivity-type semiconductor layer 4104 ranges from 1% to 5% of the area of the light emitting device region. A radius of each of the vias on the plane of the regions in which the vias are in contact with the first conductivity-type semiconductor layer 4304 may range, for example, from 5 µm to 50 µm, and the number of vias may be 1 to 50 per light emitting device region according to a width of the light emitting device region. Although different according to a width of the light emitting device region, three or more vias may be provided. A distance between the vias may range from 100 µm to 500 µm, and the vias may have a matrix structure including rows and columns. Preferably, the distance between the vias may range from 150 µm to 450 µm. If the distance between the vias is smaller than 100 µm, the amount of vias may be increased to relatively reduce a light emitting area to lower luminous efficiency, and if the distance between the vias is greater than 500 µm, current spreading may suffer degradation of luminous efficiency. A depth of the vias may range from 0.5 µm to 5.0 µm, although the depth of the vias may vary according to a thickness of the second conductivity-type semiconductor layer and the active layer.

The first and second electrodes 4308a and 4308b may be formed by depositing a conductive ohmic material on the light emitting laminate S. The first and second electrodes 4308a and 4308b may include at least one of silver (Ag), aluminum (Al), nickel (Ni), chromium (Cr), copper (Cu), gold (Au), palladium (Pd), platinium (Pt), tin (Sn), titanium (Ti), tungsten (W), rhodium (Rh), iridium (Ir), ruthenium (Ru), magnesium (Mg), zinc (Zn), and an alloy material thereof. For example, the second electrode 4308b may be an ohmic electrode of a silver (Ag) layer laminated on the basis of the second conductivity-type semiconductor layer 4306. The Ag ohmic electrode may serve as a reflective layer of light. A single layer of nickel (Ni), titanium (Ti), platinum (Pt), tungsten (W), or an alloy layer thereof may be alternatively laminated on the Ag layer. In detail, an Ni/Ti layer, a TiW/Pt layer, or a Ti/W layer may be laminated on an Ag layer, or these layers may be alternately laminated on the Ag layer.

As the first electrode 4308a, from the first conductivity-type semiconductor layer 4304, a Cr layer may be laminated and Au/Pt/Ti layers may be sequentially laminated on the Cr layer, or from the second conductivity-type semiconductor layer 4306, an Al layer may be laminated and Ti/Ni/Au layers may be sequentially laminated on the Al layer. The first and second electrodes 4308a and 4308b may be made of various other materials or may have various other lamination structures in order to enhance ohmic characteristics or reflecting characteristics.

The insulating part 4303 may have an open area exposing at least portions of the first and second electrodes 4308a and 4308b, and the first and second electrode pads 4319a and 4319b may be connected to the first and second electrodes 4308a and 4308b, respectively. The insulating part 4303 may be deposited to have a thickness ranging from 0.01 μm to 3 μm at a temperature equal to or lower than 500° C. through an $SiO_2$ and/or SiN CVD process.

The first and second electrodes 4308a and 4308b may be disposed or extend in the same direction and may be mounted as a so-called flip-chip on a lead frame, or the like, as described hereinafter.

In particular, the first electrode 4308a may be connected to the first electrical connection part 4309a having a conductive via connected to the first conductivity-type semiconductor layer 4304 by passing through the second conductivity-type semiconductor layer 4306 and the active layer 4305 within the light emitting laminate S.

The amount, a shape, a pitch, a contact area with the first conductivity-type semiconductor layer 4304, and the like, of the conductive via and the first electrical connection part 4309a may be appropriately regulated in order to lower contact resistance, and the conductive via and the first electrical connection part 4309a may be arranged in a row and in a column to improve current flow.

Another electrode structure may include the second electrode 4308b directly formed on the second conductivity-type semiconductor layer 4306 and the second electrical connection portion 4309b formed on the second electrode 4308b. In addition to having a function of forming electrical-ohmic connection with the second conductivity-type semiconductor layer 4306, the second electrode 4308b may be made of a light reflective material, whereby, as illustrated in FIG. 13, in a state in which the LED chip 4310 is mounted as a so-called flip chip structure, light emitted from the active layer 4305 can be effectively emitted in a direction of the substrate 4301. Of course, the second electrode 4308b may be made of a light-transmissive conductive material such as a transparent conductive oxide, according to a main light emitting direction.

The two electrode structures as described above may be electrically separated by the insulating part 4303. The insulating part 4303 may be made of any material as long as it has electrically insulating properties. Namely, the insulating part 4303 may be made of any material having electrically insulating properties, and here, preferably, a material having a low degree of light absorption is used. For example, a silicon oxide or a silicon nitride such as $SiO_2$, $SiO_xN_y$, $Si_xN_y$, or the like, may be used. If necessary, a light reflective filler may be dispersed within the light-transmissive material to form a light reflective structure.

The first and second electrode pads 4319a and 4319b may be connected to the first and second electrical connection parts 4309a and 4309b to serve as external terminals of the LED chip 4310, respectively. For example, the first and second electrode pads 4319a and 4319b may be made of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. In this case, when the LED chip is mounted on the mounting substrate 4320, the first and second electrode pads 4319a and 4319b may be bonded by using the eutectic metal, so solder bumps generally required for flip chip bonding may not be used. The use of a eutectic metal advantageously obtains superior heat dissipation effects in the mounting method in comparison to the case of using solder bumps. In this case, in order to obtain excellent heat dissipation effects, the first and second electrode pads 4319a and 4319b may be formed to occupy a relatively large area.

The substrate 4301 and the light emitting laminate S may be understood with reference to the content described above with reference to FIG. 10, unless otherwise described. Also, although not shown, a buffer layer may be formed between the light emitting structure S and the substrate 4301. The buffer layer may be employed as an undoped semiconductor layer made of a nitride, or the like, to alleviate lattice defects of the light emitting structure grown thereon.

The substrate 4301 may have first and second main surfaces opposing one another, and an uneven structure C (i.e., an uneven surface having a depression and protrusion pattern) may be formed on at least one of the first and second main surfaces. The uneven structure formed on one surface of the substrate 4301 may be formed by etching a portion of the substrate 4301 so as to be made of the same material as that of the substrate 4301. Alternatively, the uneven structure may be made of a heterogeneous material different from that of the substrate 4301.

In an embodiment of the present inventive concept, since the uneven structure is formed on the interface between the substrate 4301 and the first conductivity-type semiconductor layer 4304, paths of light emitted from the active layer 4305 can be of diversity, and thus, a quantity of light absorbed within the semiconductor layer can be reduced and a quantity of light scattering can be increased, increasing light extraction efficiency.

In detail, the uneven structure may be formed to have a regular or irregular shape. The heterogeneous material used to form the uneven structure may be a transparent conductor, a transparent insulator, or a material having excellent reflectivity. Here, as the transparent insulator, a material such as $SiO_2$, SiNx, $Al_2O_3$, HfO, $TiO_2$, or ZrO may be used. As the transparent conductor, a transparent conductive oxide (TCO) such as ZnO, an indium oxide containing an additive (e.g., Mg, Ag, Zn, Sc, Hf, Zr, Te, Se, Ta, W, Nb, Cu, Si, Ni, Co, Mo, Cr, Sn), or the like, may be used. As the reflective material, silver (Ag), aluminum (Al), or a distributed Bragg reflector (DBR) including multiple layers having different refractive indices, may be used. However, the present inventive concept is not limited thereto.

The substrate 4301 may be removed from the first conductivity-type semiconductor layer 4304. To remove the substrate 4301, a laser lift-off (LLO) process using a laser, an etching or a polishing process may be used. Also, after the substrate 4301 is removed, depressions and protrusions may be formed on the surface of the first conductivity-type semiconductor layer 1304.

As illustrated in FIG. 13, the LED chip 4310 may be mounted on the mounting substrate 4320. The mounting substrate 4320 may include upper and lower electrode layers 4312b and 4312a formed on upper and lower surfaces of the substrate body 4311, and vias 4313 penetrating through the substrate body 4311 to connect the upper and lower electrode layers 4312b and 4312a. The substrate body 4311 may be made of a resin, a ceramic, or a metal, and the upper or lower electrode layer 4312b or 4312a may be a metal layer made of gold (Au), copper (Cu), silver (Ag), or aluminum (Al).

Of course, the substrate on which the foregoing LED chip 4310 is mounted is not limited to the configuration of the mounting substrate 4320 illustrated in FIG. 13, and any substrate having a wiring structure for driving the LED chip 4310 may be employed. For example, any one of the substrates described above with reference to FIGS. 3 through 9 may be employed, or a package structure in which an LED chip is mounted on a package body having a pair of lead frames may be provided.

<Other Examples of Light Emitting Devices>

LED chips having various structures other than that of the foregoing LED chip described above may also be used. For example, an LED chip in which surface-plasmon polaritons (SPP) are formed in a metal-dielectric boundary of an LED chip to interact with quantum well excitons, thus obtaining significantly improved light extraction efficiency, may also be advantageously used.

Meanwhile, the light emitting element 400 may include at least one of a light emitting device emitting white light by combining yellow, green, red, and orange phosphors with a blue LED chip and a purple, blue, green, red, and infrared light emitting device. In this case, the light emitting element 400 may control a color rendering index (CRI) to range from a sodium-vapor (Na) lamp level (40) to a sunlight level (100), or the like, and control a color temperature ranging from 2,000K to 20,000K level to generate various levels of white light. If necessary, the light emitting element 400 may generate visible light having purple, blue, green, red, orange colors, or infrared light to adjust an illumination color according to a surrounding atmosphere or mood. Also, the light emitting device may generate light having a special wavelength stimulating plant growth.

White light generated by combining yellow, green, red phosphors to a blue LED and/or combining at least one of a green LED and a red LED thereto may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram. Alternatively, white light may be positioned in a region surrounded by a spectrum of black body radiation and the segment. A color temperature of white light corresponds to a range from about 2,000K to about 20,000K.

Phosphors may have the following empirical formula and colors.

Oxide-based phosphors: Yellow and green Y3Al5O12:Ce, Tb3Al5O12:Ce, Lu3Al5O12:Ce

Silicate-based phosphors: Yellow and green (Ba,Sr)2SiO4:Eu, yellow and orange (Ba,Sr)3SiO5:Ce Nitride-baed phosphors: Green β—SiAlON:Eu, yellow La3Si6O11:Ce, orange α-SiAlON:Eu, red CaAlSiN3:Eu, Sr2Si5N8:Eu, SrSiAl4N7:Eu Fluoride-based phosphors: KSF-based red K2SiF6:Mn4+

Phosphor compositions may be basically conformed with Stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone, or a coactivator, or the like, may be additionally applied to change characteristics.

Also, materials such as quantum dots, or the like, may be applied as materials that replace phosphors, and phosphors and quantum dots may be used in combination or alone in an LED.

A quantum dot may have a structure including a core (3 nm to 10 nm) including such as CdSe, InP, or the like, a shell (0.5 nm to 2 nm) including such as ZnS, ZnSe, or the like, and a ligand for stabilizing the core and the shell, and may implement various colors according to sizes.

Table 1 below shows types of phosphors in applications fields of white light emitting devices using a blue LED (wavelength: 440 nm to 460 nm).

TABLE 1

| Purpose | Phosphors |
| --- | --- |
| LED TV BLU | β-SiAlON:Eu2+ |
|  | (Ca, Sr)AlSiN3:Eu2+ |
|  | La3Si6O11:Ce3+ |
|  | K2SiF6:Mn4+ |
| Lighting Devices | Lu3Al5O12:Ce3+ |
|  | Ca-α-SiAlON:Eu2+ |
|  | La3Si6N11:Ce3+ |
|  | (Ca, Sr)AlSiN3:Eu2+ |
|  | Y3Al5O12:Ce3+ |
|  | K2SiF6:Mn4+ |
| Side Viewing | Lu3Al5O12:Ce3+ |
| (Mobile, Notebook PC) | Ca-α-SiAlON:Eu2+ |
|  | La3Si6N11:Ce3+ |
|  | (Ca, Sr)AlSiN3:Eu2+ |
|  | Y3Al5O12:Ce3+ |
|  | (Sr, Ba, Ca, Mg)2SiO4:Eu2+ |
|  | K2SiF6:Mn4+ |
| Electrical Components | Lu3Al5O12:Ce3+ |
| (Vehicle Head Lamp, etc.) | Ca-α-SiAlON:Eu2+ |
|  | L3Si6N11:Ce3+ |
|  | (Ca, Sr)AlSiN3:Eu2+ |
|  | Y3Al5O12:Ce3+ |
|  | K2SiF6:Mn4+ |

Phosphors or quantum dots may be applied by using at least one of a method of spraying them on a light emitting device, a method of covering as a film, and a method of attaching as a sheet of ceramic phosphor, or the like.

As the spraying method, dispensing, spray coating, or the like, is generally used, and dispensing may include a pneumatic method and a mechanical method such as a screw fastening scheme, a linear type fastening scheme, or the like. Through a jetting method, an amount of dotting may be controlled through a very small amount of discharging and color coordinates (or chromaticity) may be controlled therethrough. In the case of a method of collectively applying phosphors on a wafer level or on a mounting board on which an LED is mounted, productivity can be enhanced and a thickness can be easily controlled.

The method of directly covering a light emitting device with phosphors or quantum dots as a film may include electrophoresis, screen printing, or a phosphor molding method, and these methods may have a difference according to whether a lateral surface of a chip is required to be coated or not.

Meanwhile, in order to control efficiency of a long wavelength light emitting phosphor re-absorbing light emitted in a short wavelength, two or more phosphor layers having different light emitting wavelength can be provided separately. In order to minimize re-absorption and interference of chips and two or more wavelengths, a DBR (omni-directional reflector (ODR)) layer may be included between respective layers. In order to form a uniformly coated film, a phosphor can be provided as a film or a ceramic form, and the film or the ceramic form including a phosphor can be attached to a chip or a light emitting device. In order to differentiate light efficiency and light distribution characteristics, a light conversion material may be positioned in a remote form, and in this case, the light conversion material may be positioned together with a material such as a light-transmissive polymer, glass, or the like, according to durability and heat resistance.

A phosphor applying technique may play the most important role in determining light characteristics in an LED device, so techniques of controlling a thickness of a phosphor application layer, a uniform phosphor distribution, and the like, have been variously researched.

A quantum dot (QD) may also be positioned in a light emitting device in the same manner as that of a phosphor, and may be positioned in glass or a light-transmissive polymer material to perform optical conversion.

Meanwhile, in order to protect a light emitting device from an external environment or in order to improve light extraction efficiency of light emitted to the outside of a light emitting device, a light-transmissive material may be positioned on the light emitting device as a filler. In this case, a transparent organic solvent such as epoxy, silicon, a hybrid of epoxy and silicon, or the like, may be applied as a light-transmissive material, and the light-transmissive material may be cured according to heating, light irradiation, a time-lapse method, or the like.

In the case of silicon, polydimethyl siloxane is classified as a methyl-based silicon and polymethylphenyl siloxane is classified as a phenyl-based silicon. The methyl-based silicon and the phenyl-based silicon have differences in refractive indexes, water vapor transmission rates, light transmittance amounts, light fastness qualities, and thermostability. Also, the methyl-based silicon and the phenyl-based silicon have differences in curing speeds according to a cross linker and a catalyst, affecting phosphor distribution.

Light extraction efficiency varies according to a refractive index of a filler, and in order to minimize a gap between a refractive index of the outermost medium of a chip in a portion from which blue light is emitted and a refractive index of a portion emitted to air, two or more types of silicon having different refractive indices may be sequentially laminated.

In general, the methyl-based silicon has the highest level of thermostability, and variations in a temperature increase are reduced in order of phenyl-based silicon, hybrid silicon, and epoxy silicon. Silicon may be classified as a gel-type silicon, an elastomer-type silicon, and a resin-type silicon according to the degree of hardness thereof.

The light emitting device may further include an optical element for radially guiding light irradiated from the light emitting device. In this case, a previously formed optical element may be attached to a light emitting device, or a fluidic organic solvent may be injected into a mold with a light emitting device mounted therein and solidified.

The optical element attachment method may include directly attaching an optical element to a filler, bonding only an upper portion of a chip or an outer portion of a light emitting device or an outer portion of the optical element, spaced apart from the filler, and the like. As the method of injecting into a mold, injection molding, transfer molding, compression molding, or the like, may be used. Light distribution characteristics may be changed according to lens shapes (concave, convex, uneven, conical, and geometrical structures), and the optical element may be modified according to efficiency and light distribution characteristics.

Hereinafter, an operation of the control circuit illustrated in FIGS. 1 and 2 will be described with reference to FIG. 14.

Figure 14:
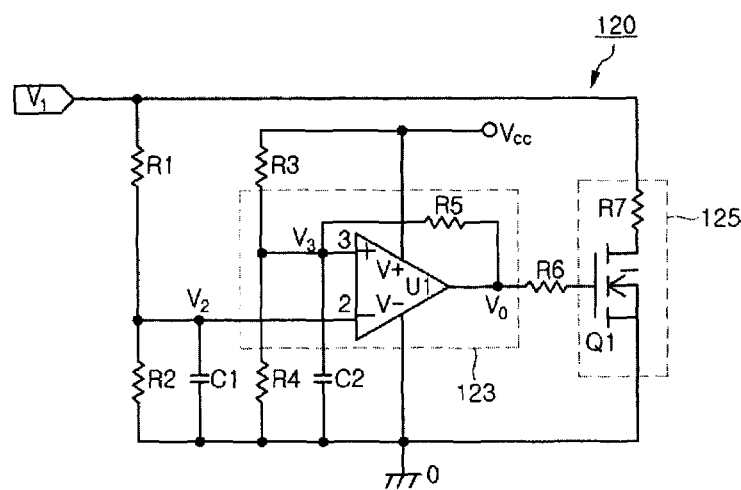
FIG. 14 is a circuit diagram illustrating an embodiment of the control circuit of FIGS. 1 and 2.

FIG. 14 is a circuit diagram illustrating an embodiment of the control circuit of FIGS. 1 and 2.

Referring to FIG. 14, the control circuit 120 according to an embodiment of the present disclosure may include a comparison circuit 123 including an operational amplifier U1 and a bleeder circuit 125 including a resistor R7, a switching element Q1, and the like. The control circuit 120 may include resistors R2-R5 and capacitors C1 and C2 as shown in FIG. 14. When an N-MOSFET is applied as the switch element Q1 as illustrated in FIG. 3, the gate of the switching element Q1 may be connected to an output terminal of the operational amplifier U1 and the resistor R7 may be connected to a drain of the switching element Q1.

The comparison circuit 123 including the operational amplifier U1 may operate as a Schmitt trigger circuit having hysteresis characteristics. A reference signal $V_3$ obtained by distributing a voltage VCC may be applied to a non-inverting terminal of the operational amplifier U1, and an input signal $V_2$ generated from the output voltage $V_1$ (see also FIG. 1) of the first converter 113 (see FIG. 1) may be applied to an inverting terminal of the operational amplifier U1. The reference signal $V_3$ applied to the non-inverting terminal may correspond to the lower limit reference voltage $V_{th2}$ at which the second converter 115 may operate normally.

When a level of the input signal $V_2$ applied to the inverting terminal is higher than that of the reference signal $V_3$ applied to the non-inverting terminal in the operational amplifier U1 operating as a Schmitt trigger circuit, a signal $V_0$ having a low level may be outputted from an output terminal of the operational amplifier U1. Thus, the switching element Q1 may be turned off and no current flows through the resistor R7.

Conversely, when the level of the input signal $V_2$ applied to the inverting terminal is lower than that of the reference signal $V_3$ applied to the non-inverting terminal in the operational amplifier U1, a signal $V_0$ having a high level may be outputted from the output terminal of the operational amplifier U1. Thus, the switching element Q1 may be turned on and a current flows through the resistor R7. Based on such operational characteristics, when the voltage $V_1$ is repeatedly increased and decreased due to a ripple component at a level similar to that of the voltage $V_{th2}$ malfunctions of the second converter 115 can be prevented. This will be described with reference to the graphs of FIGS. 15 through 18.

FIGS. 15 through 18 are waveform views illustrating operations of the LED driving device according to an embodiment of the present disclosure.

Figure 15:
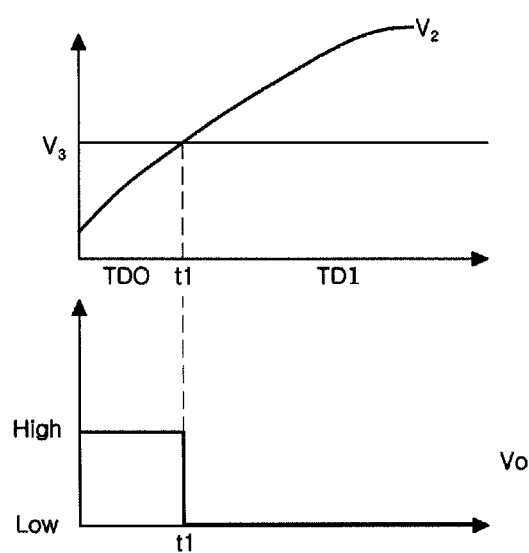
FIGS. 15 through 18 are waveform views illustrating operations of the LED driving device according to an embodiment of the present disclosure.
Figure 16:
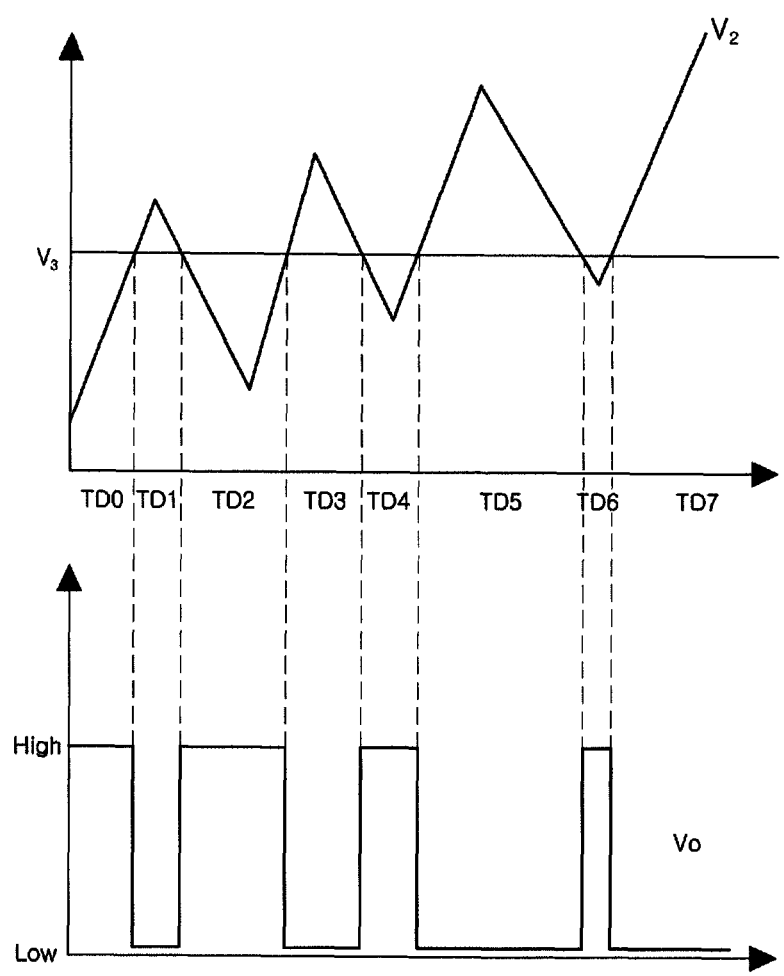

First, FIGS. 15 and 16 are waveform views illustrating an output signal of the operational amplifier U1 and a corresponding operation of the switching element Q1 when a level of the voltage $V_2$ generated from the voltage $V_1$ and inputted to the inverting terminal of the operational amplifier U1 is gradually increased. Specifically, FIG. 15 is a waveform view illustrating a case in which the voltage $V_1$ does not include a ripple component, and FIG. 16 is a waveform view illustrating a case in which the voltage $V_1$ includes a ripple component.

Referring to FIG. 15 assuming the case in which a ripple component is not included in the voltage $V_1$, a level of the voltage $V_2$ generated from the voltage $V_1$ is lower than that of the voltage $V_3$ as a reference signal in a time duration TD0 ahead of a point in time t1. Thus, the operational amplifier U1 may output a signal having a high level in the time duration TD0, and the switch Q1 may be turned on to allow a current to flow to the resistor R7.

When the voltage $V_2$ is increased to become higher than the voltage $V_3$ in a time duration TD1 following the point in time t1, the signal outputted from the operational amplifier U1 may be changed to have a low level from the high level and the switching element Q1 may be turned off. Thus, a current does not flow to the resistor R7, and resistance of the output terminal of the first converter 113, from which the voltage $V_1$ is outputted, may be increased. The first converter 113 may operate as a constant current converter, and thus, as the resistance is increased to uniformly maintain the output current, the level of the voltage $V_1$ outputted by the first converter 113 may be increased and the voltage $V_2$ inputted to the inverting terminal of the operational amplifier U1 may be increased to maintain the switching element Q1 in the turned-off state.

Referring to FIG. 16 assuming the case in which a ripple component is included in the voltage $V_1$, the voltage $V_2$ may include a ripple component, unlike the case of FIG. 15. Thus, in time durations in which the voltage $V_2$ is increased overall, levels of the voltage $V_2$ may be repeatedly higher or lower than the level of the voltage $V_3$ due to the ripple component. As illustrated in FIG. 16, levels of $V_2$ are lower than that of $V_3$ in time durations TD0, TD2, TD4, and TD6, and higher than in time durations TD1, TD3, TD5, and TD7.

As a result, the signal outputted from the operational amplifier U1 may have a high level in the time durations TD0, TD2, TD4, and TD6, and have a low level in the time durations TD1, TD3, TD5, and TD7. Thus, the switching element Q1 may be repeatedly turned on and off during a short period in the time durations TD0 to TD8, and thus, the voltage V1 outputted from the first converter 113 may be also repeatedly increased and decreased. As a result, the operation of the second converter 115 may become unstable, resulting in a flickering phenomenon in which the LEDs connected to the output terminal of the second converter 115 flicker.

In an embodiment of the present disclosure, the voltage $V_1$ may be connected to the drain of the switching element Q1, which is controlled to be turned on or off by the signal output from the operational amplifier U1, through the resistor R7. Thus, when the voltage $V_2$ currently in the time duration TD0 enters the time duration TD1 to be higher than the voltage $V_3$ the switching element Q1 may be turned off and the current flowing to the resistor R7 may entirely flow through the resistor R1. Since no current flows to the resistor R7, a load at the output terminal of the first converter 113 may be increased, and thus, the output voltage $V_1$ from the first converter 113 may be increased to control a constant current.

As the voltage $V_1$ is increased, the level of the voltage $V_2$ inputted to the inverting terminal of the operational amplifier U1 may be instantaneously increased, and thus, the voltage $V_2$ may have a level higher than that of the voltage $V_3$ in the time duration TD2 even though the ripple component is considered. Thus, the voltage $V_2$ may continuously have the level higher than that of the voltage $V_3$ since the time duration TD2, and thus, the switching element Q1 may be maintained in a turned-off state, rather than being repeatedly turned on and off. Since the voltage $V_1$ is sharply increased in the boundary between the time durations TD0 and TD1, the voltage $V_1$ may have a value greater than the minimum voltage $V_{th2}$ for operating the light emitting unit 330, and accordingly, the second converter 115 may stably operate.

Figure 17:
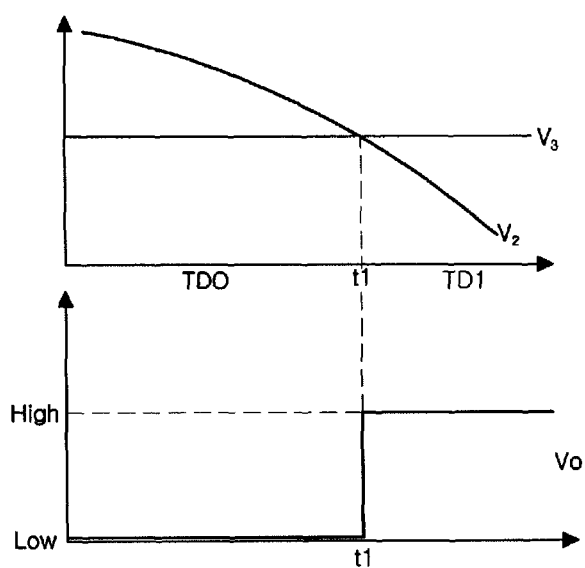
Figure 18:
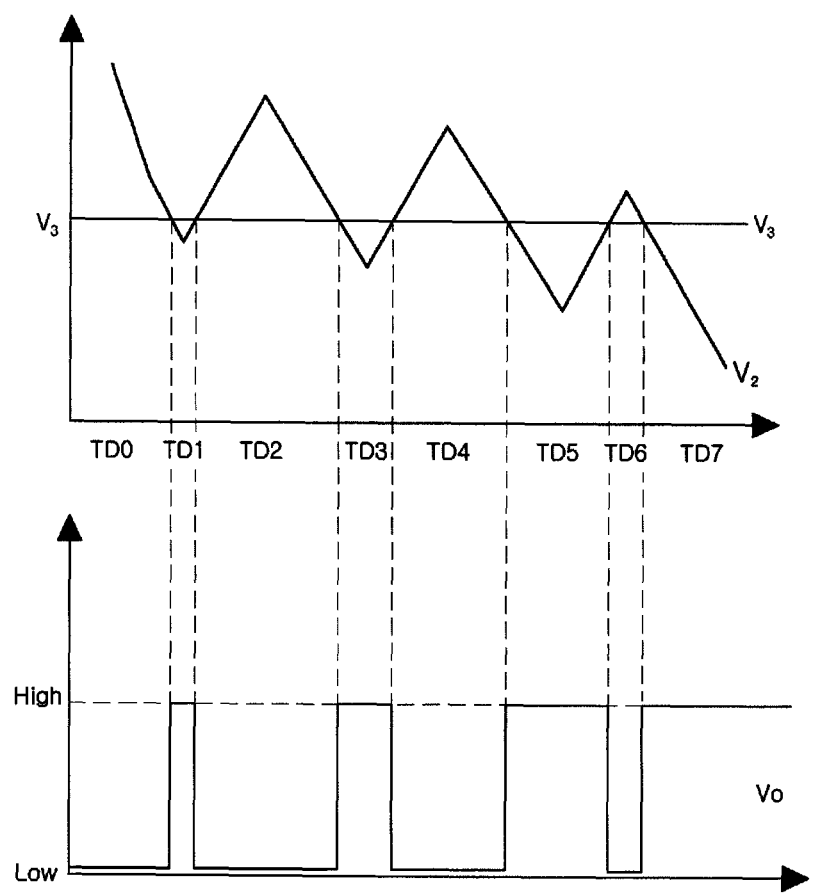

FIGS. 17 and 18 are waveform views illustrating a signal outputted from the operational amplifier U1 and a corresponding operation of the switching element Q1 when the level of the voltage $V_2$ generated from the $V_1$ and inputted to the inverting terminal of the operational amplifier U1 is gradually decreased. Specifically, FIG. 17 is a waveform view illustrating a case in which a ripple component is not included in the voltage $V_1$, and FIG. 18 is a waveform view illustrating a case in which a ripple component is included in the voltage $V_1$.

First, referring to FIG. 17, a level of the voltage $V_2$ may be higher than that of the voltage $V_3$ as a reference signal in the time duration TD0 earlier than the point in time t1. Thus, in the time duration TD0, the operational amplifier U1 may output a low level signal, the switching element Q1 may be turned off, and no current may flow to the resistor R7.

When the voltage $V_2$, entering the time duration TD1, has a level lower than that of the voltage $V_3$, the signal outputted from the operational amplifier U1 may be changed to have a high level from low level and the switching element Q1 may be turned on. Accordingly, a current may flow to the resistor R7 to reduce a load of the first converter 113, and the voltage $V_1$ outputted from the first converter 113 may be reduced for constant current control. The voltage $V_2$ applied to the inverting terminal of the operational amplifier U1 may be also sharply reduced, starting from the point in time t1, and the switching element Q1 may be maintained in the turned-on state.

Referring to FIG. 18 assuming a case in which a ripple component is included in the voltage $V_1$, the ripple component included in the voltage $V_1$ is also reflected in the voltage $V_2$, and accordingly, the voltage $V_2$ may have a level higher than that of the voltage $V_3$ in the time durations TD0, TD2, TD4, and TD6, and have a level lower than that of the voltage $V_3$ in the time durations TD1, TD3, TD5, and TD7. Thus, like the case illustrated in FIG. 16, the switching element Q1 may be repeatedly turned on and turned off to make the second converter 115 operate unstably, resulting in an occurrence of a flicker phenomenon in the LEDs connected to the output terminal of the second converter 115.

In an embodiment of the present inventive concept, since the voltage $V_1$ is applied to the drain of the switching element Q1 through the resistor R7, such a flicker phenomenon can be prevented. When the voltage $V_2$ is lower than the voltage $V_3$, starting from the point in time t1, the switching element Q1 may be changed from the turned-off state to a turned-on state, allowing a current to flow through the resistor R7. When a current flows through the resistor R7, a load of the output terminal of the first converter 113 may be reduced, and thus, the voltage $V_1$ outputted from the first converter 113 may be reduced for constant current control. In this case, the level of the voltage $V_2$ generated from the voltage $V_1$ may be also reduced, and thus, the voltage $V_2$ may be maintained to have a level lower than the voltage $V_3$ following the time point t1 in spite of the ripple component included therein. Thus, the switching element Q1 may be maintained in the turned-on state, rather than being repeatedly turned on and turned off after the point in time t1, whereby the second converter 115 may operate stably.

Meanwhile, the LED driving device 100 (see FIG. 1) or the lighting device 200 including the LED driving device 100 as described above may be applied to an indoor lighting device or an outdoor lighting device according to the purpose thereof. The indoor LED lighting device may include a lamp, a fluorescent lamp (LED-tube), a flat panel type lighting device replacing an existing lighting fixture (retrofit), and the outdoor LED lighting device may include a streetlight, a security light, a flood light, a scene lamp, a traffic light, and the like.

Also, the lighting device using LEDs may be utilized as an internal or external light source of a vehicle. As an internal light source, the lighting device using the LED may be used as an indoor light of a vehicle, a reading light, or as various dashboard light sources. As an external light source, the lighting device using the LED may be used as for a light source in vehicle lighting fixture such as a headlight, a brake light, a turn signal lamp, a fog light, a running light, and the like.

In addition, the LED lighting device may also be applicable as a light source used in robots or various mechanic facilities. In particular, LED lighting using light within a particular wavelength band may accelerate plant growth, and stabilize a user's mood or treat a disease using sensitivity (or emotional) illumination (or lighting).

A lighting system employing the foregoing lighting device will be described with reference to FIGS. 19 through 22. The lighting system according to an embodiment of the present inventive concept may automatically regulate a color temperature according to a surrounding environment (e.g., temperature and humidity) and provide a lighting device as sensitivity lighting meeting human sensitivity, rather than serving as simple lighting.

Figure 19:
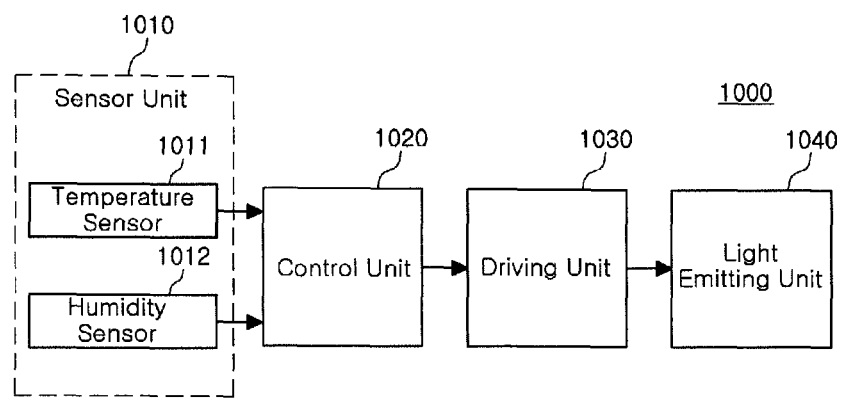
FIG. 19 is a block diagram schematically illustrating a lighting system according to an embodiment of the present disclosure.

FIG. 19 is a block diagram schematically illustrating a lighting system according to an embodiment of the present disclosure.

Referring to FIG. 19, a lighting system 1000 according to an embodiment of the present disclosure may include a sensor unit 1010, a control unit 1020, a driving unit 1030, and a light emitting unit 1040.

The sensor unit 1010 may be installed in an indoor or outdoor area, and may have a temperature sensor 1011 and a humidity sensor 1012 to measure at least one air condition among an ambient temperature and humidity. The sensor unit 1010 delivers the measured air condition, i.e., the measured temperature and humidity, to the control unit 1020 electrically connected thereto.

The control unit 1020 may compare the measured air temperature and humidity with air conditions (temperature and humidity ranges) previously set by a user, and determines a color temperature of the light emitting unit 1040 corresponding to the air condition. To this end, the control unit 1020 may be electrically connected to the driving unit 1030, and control the light emitting unit 1040 to be driven at the determined color temperature.

Figure 20:
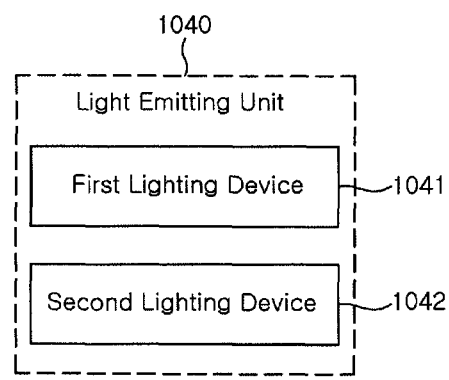
FIG. 20 is a block diagram schematically illustrating a detailed configuration of the lighting unit of the lighting system illustrated in FIG. 19.

The light emitting unit 1040 operates according to power supplied by the driving unit 1030. The light emitting unit 1040 may include at least one lighting device illustrated in FIGS. 20 to 22. For example, as illustrated in FIG. 20, the light emitting unit 1040 may include a first lighting device 1041 and a second lighting device 1042 having different color temperatures, and f the lighting devices 1041 and 1042 may include a plurality of light emitting devices emitting the same white light, respectively.

The first lighting device 1041 may emit white light having a first color temperature, and the second lighting device 1042 may emit white light having a second color temperature, and here, the first color temperature may be lower than the second color temperature. Conversely, the first color temperature may be higher than the second color temperature. Here, white color having a relatively low color temperature may correspond to a warm white color, and white color having a relatively high color temperature may correspond to a cold white color. When power is supplied to the first and second lighting devices 1041 and 1042, the first and second lighting devices 1041 and 1042 may emit white light having first and second color temperatures, respectively, and the respective white light may be mixed to implement white light having a color temperature determined by the control unit 1020.

In detail, when the first color temperature is lower than the second color temperature, if the color temperature determined by the control unit 1020 is relatively high, an amount of light from the first lighting device 1041 may be reduced and an amount of light from the second lighting device 1042 may be increased to implement mixed white light having the determined color temperature. Conversely, when the determined color temperature is relatively low, an amount of light from the first lighting device 1041 may be increased and an amount of light from the second lighting device 1042 may be reduced to implement white light having the determined color temperature. Here, the amount of light from each of the lighting devices 1041 and 1042 may be implemented by differently regulating an amount of power supplied from the driving unit 1030 or may be implemented by regulating the number of driven light emitting devices.

Figure 21:
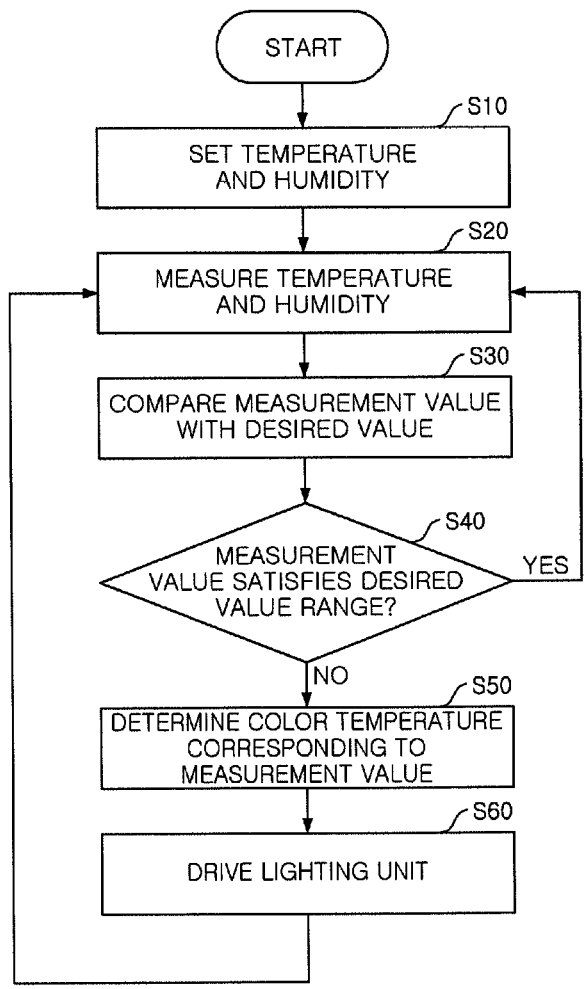
FIG. 21 is a flow chart illustrating a method for controlling the lighting system illustrated in FIG. 19.

FIG. 21 is a flowchart illustrating a method for controlling the lighting system of FIG. 19. Referring to FIG. 21, first, the user may set a color temperature according to temperature and humidity ranges through the control unit 1020 (S10). The set temperature and humidity data may be stored in the control unit 1020.

In general, when a color temperature is equal to or more than 6000K, a color providing a cool feeling, such as blue, may be produced, and when a color temperature is less than 4000K, a color providing a warm feeling, such as red, may be produced. Thus, in an embodiment of the present inventive concept, when temperature and humidity exceed 20° C. and 60%, respectively, the user may set the light emitting unit 1040 to be turned on to have a color temperature higher than 6000K through the control unit 1020. When temperature and humidity range from 10° C. to 20° C. and 40% to 60%, respectively, the user may set the light emitting unit 1040 to be turned on to have a color temperature ranging from 4000K to 6000K through the control unit 1020. When temperature and humidity are lower than 10° C. and 40%, respectively, the user may set the light emitting unit 1040 to be turned on to have a color temperature lower than 4000K through the control unit 1020.

Next, the sensor unit 1010 may measure at least one of conditions among ambient temperature and humidity (S20). The temperature and humidity measured by the sensor unit 1010 may be delivered to the control unit 1020.

Subsequently, the control unit 1020 may compare the measurement values delivered from the sensor unit 1010 with pre-set values, respectively (S30). Here, the measurement values may be temperature and humidity data measured by the sensor unit 1010, and the set values may be temperature and humidity data which have been set by the user and stored in the control unit 1020 in advance. Namely, the control unit 1020 may compare the measured temperature and humidity with the pre-set temperature and humidity.

According to the comparison results, the control unit 1020 may determine whether the measurement values satisfy the pre-set ranges (S40). When the measurement values satisfy the pre-set values, the control unit 1020 may maintain a current color temperature, and measure again temperature and humidity (S20). Meanwhile, when the measurement values do not satisfy the pre-set values, the control unit 1020 may detect pre-set values corresponding to the measurement values, and determine a corresponding color temperature (S50).

The control unit 1020 may control the driving unit 1030 to cause the light emitting unit 1040 to be driven at the determined color temperature.

Then, the driving unit 1030 may drive the light emitting unit 1040 to have the determined color temperature (S60). That is, the driving unit 1030 may supply required power to drive the light emitting unit 1040 to implement the predetermined color temperature. Accordingly, the light emitting unit 1040 may be adjusted to have a color temperature corresponding to the temperature and humidity previously set by the user according to ambient temperature and humidity.

In this manner, the lighting system 1000A may be able to automatically regulate a color temperature of the indoor lighting according to changes in ambient temperature and humidity, thereby satisfying human moods varied according to changes in the surrounding natural environment and providing psychological stability.

Figure 22:
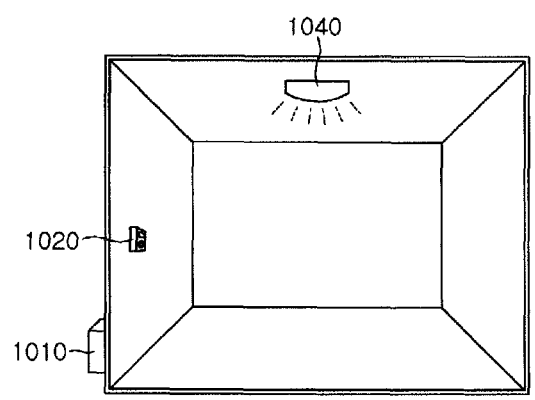
FIG. 22 is a view schematically illustrating the way in which the lighting system illustrated in FIG. 19 is used.

FIG. 22 is a view schematically illustrating the use of the lighting system of FIG. 19. As illustrated in FIG. 22, the light emitting unit 1040 may be installed on the ceiling as an indoor lamp. Here, the sensor unit 1010 may be implemented as a separate device and installed on an external wall in order to measure outdoor temperature and humidity. The control unit 1020 may be installed in an indoor area to allow the user to easily perform setting and ascertainment operations. The lighting system is not limited thereto, but may be installed on the wall in the place of an interior illumination device or may be applicable to a lamp, such as a desk lamp, or the like, that can be used in indoor and outdoor areas.

Hereinafter, another example of a lighting system using the foregoing lighting device will be described with reference to FIGS. 23 through 26. The lighting system according to an embodiment of the present inventive concept may automatically perform a predetermined control by detecting a motion of a monitored target and an intensity of illumination at a location of the monitored target.

Figure 23:
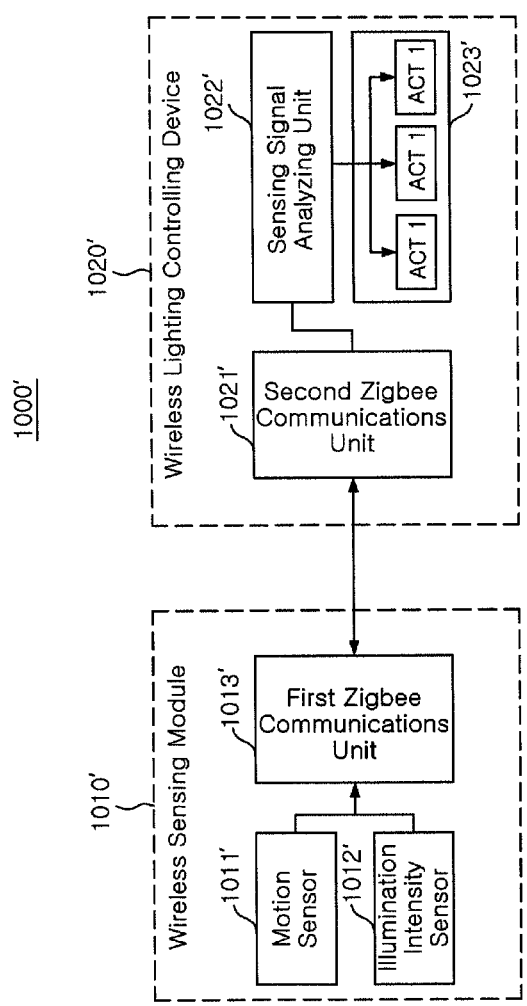
FIG. 23 is a block diagram of a lighting system according to another embodiment of the present disclosure.

FIG. 23 is a block diagram of a lighting system according to another embodiment of the present disclosure.

Referring to FIG. 23, a lighting system 1000' according to an embodiment of the present inventive concept may include a wireless sensing module 1010' and a wireless lighting controlling device 1020'.

The wireless sensing module 1010' may include a motion sensor 1011', an illumination intensity sensor 1012' for sensing an intensity of illumination, and a first wireless communications unit for generating a wireless signal and transmitting the same. The wireless signal may include a motion sensing signal from the motion sensor 1011' and an illumination intensity sensing signal from the illumination intensity sensor 1012' and comply with a predetermined communications protocol. The first wireless communications unit may include a first ZigBee communications unit 1013' for generating a ZigBee signal that complies with a pre-set communications protocol and transmitting the same.

The wireless lighting controlling device 1020' may include a second wireless communications unit for receiving the wireless signal from the first wireless communications unit and restoring a sensing signal, a sensing signal analyzing unit 1022' for analyzing the sensing signal from the second wireless communications unit, and an operation control unit 1023' for performing a predetermined control based on analysis results from the sensing signal analyzing unit 1022'. The second wireless communications unit may be configured as a second ZigBee communications unit 1021' for receiving the ZigBee signal from the first ZigBee communications unit 1013' and restoring a sensing signal.

Figures 24, 25:
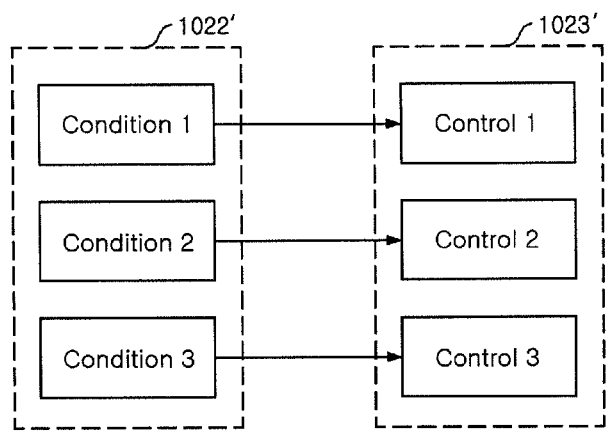
FIG. 24 is a view illustrating a format of a ZigBee signal employable in a lighting system according to an embodiment of the present disclosure.
FIG. 25 is a view illustrating a sensing signal analyzing unit and an operation control unit according to an embodiment of the present disclosure.

FIG. 24 is a view illustrating a format of a ZigBee signal according to an embodiment of the present disclosure.

Referring to FIG. 24, the ZigBee signal from the first ZigBee communications unit 1013' (see FIG. 23) may include channel information (CH) defining a communications channel, wireless network identification (ID) information (PAN_ID) defining a wireless network, a device address (Ded_Add) designating a target device, and sensing data including the motion and illumination intensity sensing signal.

Also, the ZigBee signal from the second ZigBee communications unit 1021' (see FIG. 23) may include channel information (CH) defining a communications channel, wireless network identification (ID) information (PAN_ID) defining a wireless network, a device address (Ded_Add) designating a target device, and sensing data including the motion and illumination intensity sensing signal.

The sensing signal analyzing unit 1022' may analyze the sensing signal from the second ZigBee communications unit 1021' to detect a satisfied condition, among a plurality of conditions, based on the sensed motion and the sensed intensity of illumination.

Here, the operation control unit 1023' may set a plurality of controls based on the plurality of conditions that are previously set by the sensing signal analyzing unit 1022', and perform a control corresponding to the condition detected by the sensing signal analyzing unit 1022'.

FIG. 25 is a view illustrating the sensing signal analyzing unit and the operation control unit according to an embodiment of the present disclosure. Referring to FIG. 25, for example, the sensing signal analyzing unit 1022' may analyze the sensing signal from the second ZigBee communications unit 1021' and detect a satisfied condition among first, second, and third conditions (condition 1, condition 2, and condition 3), based on the sensed motion and sensed intensity of illumination.

In this case, the operation control unit 1023' may set first, second and third controls (control 1, control 2, and control 3) corresponding to the first, second, and third conditions (condition 1, condition 2, and condition 3) previously set by the sensing signal analyzing unit 1022', and perform a control corresponding to the condition detected by the sensing signal analyzing unit 1022'.

Figure 26:
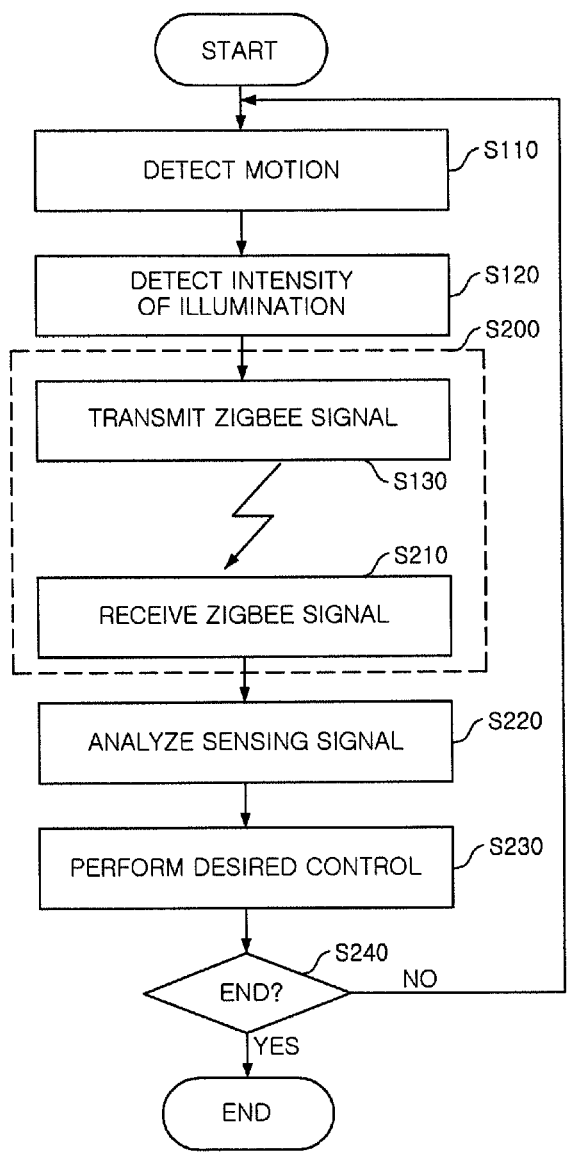
FIG. 26 is a flow chart illustrating an operation of a wireless lighting system according to an embodiment of the present disclosure.

FIG. 26 is a flowchart illustrating an operation of a wireless lighting system according to an embodiment of the present disclosure.

In FIG. 26, in operation S110, the motion sensor 1011' may detect a motion. In operation S120, the illumination intensity sensor 1012' may detect an intensity of illumination. Operation S200 is a process of transmitting and receiving a ZigBee signal. Operation S200 may include operation S130 of transmitting a ZigBee signal by the first ZigBee communications unit 1013' and operation S210 of receiving the ZigBee signal by the second ZigBee communications unit 1021'. In operation S220, the sensing signal analyzing unit 1022' may analyze a sensing signal. In operation S230, the operation control unit 1023' may perform a predetermined control. In operation S240, it may be determined whether the lighting system is terminated.

Operations of the wireless sensing module and the wireless lighting controlling device according to an embodiment of the present disclosure will be described with reference to FIGS. 23 through 26.

First, with reference to FIGS. 23, 24, and 26, the wireless sensing module 1010' of the wireless lighting system according to an embodiment of the present disclosure will be described. The wireless lighting system 1010' according to an embodiment of the present inventive concept may be installed in a location in which a lighting device is installed, to detect a current intensity of illumination of the lighting device and detect human motion near the lighting device.

Namely, the motion sensor 1011' of the wireless sensing module 1010' may be configured as an infrared sensor, or the like, capable of sensing a human. The motion sensor 1010' may sense a motion and provides the same to the first ZigBee communications unit 1013' (S110 in FIG. 26). The illumination intensity sensor 1012' of the wireless sensing module 1010' may sense an intensity of illumination and provide the same to the first ZigBee communications unit 1013' (S120).

Accordingly, the first ZigBee communications unit 1013' may generate a ZigBee signal and transmit the generated ZigBee signal wirelessly (S130). The ZigBee signal may include the motion sensing signal from the motion sensor 1010' and the illumination intensity sensing signal from the illumination intensity sensor 1012' and comply with a pre-set communications protocol.

Referring to FIG. 24, the ZigBee signal from the first ZigBee communications unit 1013' may include channel information (CH) defining a communications channel, wireless network identification (ID) information (PAN_ID) defining a wireless network, a device address (Ded_Add) designating a target device, and sensing data, and here, the sensing data may include a motion value and an illumination intensity value.

Next, the wireless lighting controlling device 1020' of the wireless lighting system according to an embodiment of the present disclosure will be described with reference to FIGS. 23 through 26. The wireless lighting controlling device 1020' of the wireless lighting system according to an embodiment of the present inventive concept may control a predetermined operation according to an illumination intensity value and a motion value included in a ZigBee signal from the wireless sensing module 1010'.

Namely, the second ZigBee communications unit 1021' of the wireless lighting controlling device 1020' according to an embodiment of the present inventive concept may receive the ZigBee signal from the first ZigBee communications unit 1013', restores a sensing signal therefrom, and provides the restored sensing signal to the sensing signal analyzing unit 1020' (S210 in FIG. 26).

Referring to FIG. 24, the ZigBee signal from the second ZigBee communications unit 1021' may include channel information (CH) defining a communications channel, wireless network identification (ID) information (PAN_ID) defining a wireless network, a device address (Ded_Add) designating a target device, and sensing data. A wireless network may be identified based on the channel information (CH) and the wireless network ID information (PAN_ID), and a sensed device may be recognized based on the device address. The sensing data may include a motion value and an illumination intensity value.

Also, referring to FIG. 23, the sensing signal analyzing unit 1022' may analyze the illumination intensity value and the motion value included in the sensing signal from the second ZigBee communications unit 1021' and provide the analysis results to the operation control unit 1023' (S220 in FIG. 26).

Accordingly, the operation control unit 1023' may perform a predetermined control according to the analysis results from the sensing signal analyzing unit 1022' (S230).

The sensing signal analyzing unit 1022' may analyze the sensing signal from the second ZigBee communications unit 1021' and detect a satisfied condition, among a plurality of conditions, based on the sensed motion and the sensed intensity of illumination. Here, the operation control unit 1023' may set a plurality of controls corresponding to the plurality of conditions set in advance by the sensing signal analyzing unit 1022', and perform a control corresponding to the condition detected by the sensing signal analyzing unit 1022'.

For example, referring to FIG. 25, the sensing signal analyzing unit 1022' may detect a satisfied condition among the first, second, and third conditions (condition 1, condition 2, and condition 3) based on the sensed motion and the sensed intensity of illumination by analyzing the sensing signal from the second ZigBee communications unit 1021'.

In this case, the operation control unit 1023' may set first, second, and third controls (control 1, control 2, and control 3) corresponding to the first, second, and third conditions (condition 1, condition 2, and condition 3) set in advance by the sensing signal analyzing unit 1022', and perform a control corresponding to the condition detected by the sensing signal analyzing unit 1022'.

For example, when the first condition (condition 1) corresponds to a case in which human motion is sensed at a front door and an intensity of illumination at the front door is not low (not dark), the first control may turn off all predetermined lamps. When the second condition (condition 2) corresponds to a case in which human motion is sensed at the front door and an intensity of illumination at the front door is low (dim), the second control may turn on some pre-set lamps (i.e., some lamps at the front door and some lamps in a living room). When the third condition (condition 3) corresponds to a case in which human motion is sensed at the front door and an intensity of illumination at the front door is very low (a very dark environment), the third control may turn on all the pre-set lamps.

Unlike the foregoing cases, besides the operation of turning lamps on or off, the first, second, and third controls may be variously applied according to pre-set operations. For example, the first, second, and third controls may be associated with operations of a lamp and an air-conditioner in summer or may be associated with operations of a lamp and heating in winter.

Other examples of a lighting system will be described with reference to FIGS. 27 through 30.

Figure 27:
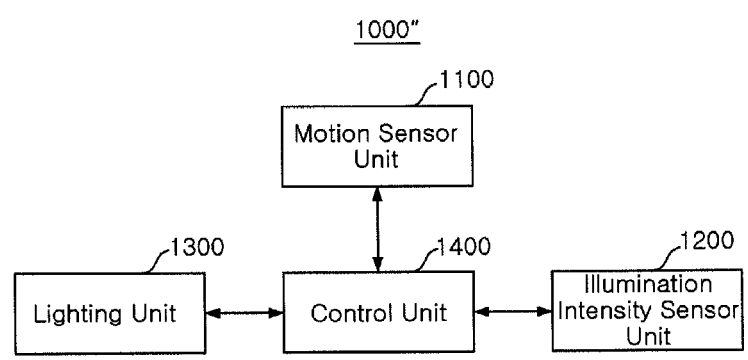
FIG. 27 is a block diagram schematically illustrating components of a lighting system according to another embodiment of the present disclosure.

FIG. 27 is a block diagram schematically illustrating constituent elements of a lighting system according to another embodiment of the present disclosure. A lighting system 1000" according to an embodiment of the present inventive concept may include a motion sensor unit 1100, an illumination intensity sensor unit 1200, a lighting unit 1300, and a control unit 1400.

The motion sensor unit 1100 may sense a motion of an object. For example, the lighting system may be attached to a movable object, such as, for example, a container or a vehicle, and the motion sensor unit 1100 may sense a motion of the moving object. When the motion of the object to which the lighting system is attached is sensed, the motion sensor unit 1100 may output a signal to the control unit 1400 and the lighting system may be activated. The motion sensor unit 1100 may include an accelerometer, a geomagnetic sensor, or the like.

The illumination intensity sensor unit 1200, a type of optical sensor, may measure an intensity of illumination of a surrounding environment. When the motion sensor unit 1100 senses the motion of the object to which the lighting system is attached, the illumination intensity sensor unit 1200 may be activated according to a signal output by the control unit 1400. The lighting system may illuminate during night work or in a dark environment to call a worker or an operator's attention to their surroundings, and allow a driver to secure visibility at night. Thus, even when the motion of the object to which the lighting system is attached is sensed, if an intensity of illumination higher than a predetermined level is secured (during the day), the lighting system may not be required to illuminate. Also, even in the daytime, if it rains, the intensity of illumination may be fairly low, so there may be a need to inform a worker or an operator about a movement of a container, and thus, the light emitting unit is required to emit light. Thus, whether to turn on the lighting unit 1300 may be determined according to an illumination intensity value measured by the illumination intensity sensor unit 1200.

The illumination intensity sensor unit 1200 may measure an intensity of illumination of a surrounding environment and output the measured value to the control unit 1400. Meanwhile, when the illumination intensity value is equal to or higher than a pre-set value, the lighting unit 1300 may not be required to emit light, so the overall system may be terminated.

When the illumination intensity value measured by the illumination intensity sensor unit 1200 is lower than the pre-set value, the lighting unit 1300 may emit light. The worker or the operator may recognize the light emissions from the lighting unit 1300 to recognize the movement of the container, or the like. As the lighting unit 1300, the foregoing lighting device may be employed.

Also, the lighting unit 1300 may adjust intensity of light emissions thereof according to the illumination intensity value of the surrounding environment. When the illumination intensity value of the surrounding environment is low, the lighting unit 1300 may increase the intensity of light emissions thereof, and when the illumination intensity value of the surrounding environment is relatively high, the lighting unit 1300 may decrease the intensity of light emissions thereof, thus preventing power wastage.

The control unit 1400 may control the motion sensor unit 1100, the illumination intensity sensor unit 1200, and the lighting unit 1300 overall. When the motion sensor unit 1100 senses the motion of the object to which the lighting system is attached, and outputs a signal to the control unit 1400, the control unit 1400 may output an operation signal to the illumination intensity sensor unit 1200. The control unit 1400 may receive an illumination intensity value measured by the illumination intensity sensor unit 1200 and determine whether to turn on (operate) the lighting unit 1300.

Figure 28:
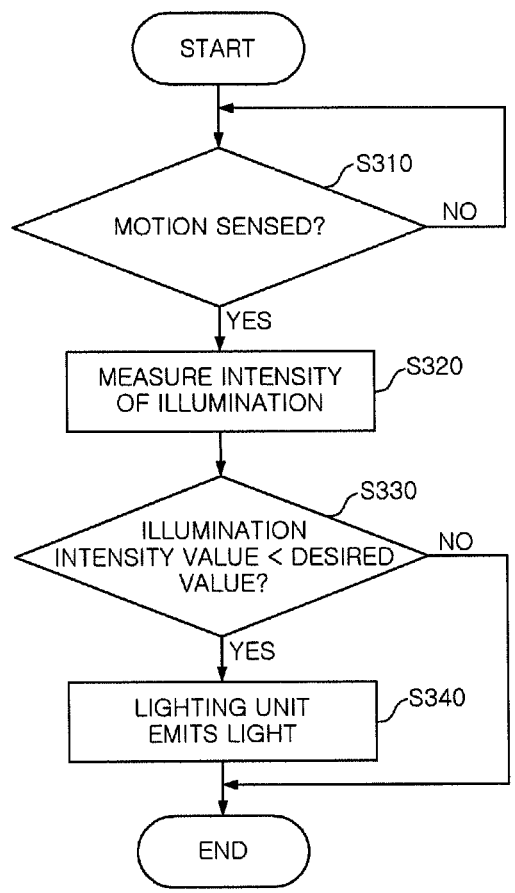
FIG. 28 is a flow chart illustrating a method for controlling a lighting system according to an embodiment of the present disclosure.

FIG. 28 is a flowchart illustrating a method for controlling a lighting system. Hereinafter, a method for controlling a lighting system will be described with reference to FIG. 28.

First, a motion of an object to which the lighting system is attached may be sensed and an operation signal may be output (S310). For example, the motion sensor unit 1100 may sense a motion of a container or a vehicle in which the lighting system is installed, and when the motion of the container or the vehicle is sensed, the motion sensor unit 1100 may output an operation signal. The operation signal may be a signal for activating overall power. Namely, when the motion of the container or the vehicle is sensed, the motion sensor unit 1100 may output the operation signal to the control unit 1400.

Next, based on the operation signal, an intensity of illumination of a surrounding environment may be measured and an illumination intensity value is output (S320). When the operation signal is applied to the control unit 1400, the control unit 1400 may output a signal to the illumination intensity sensor unit 1200, and then the illumination intensity sensor unit 1200 may measure the intensity of illumination of the surrounding environment. The illumination intensity sensor unit 1200 may output the measured illumination intensity value of the surrounding environment to the control unit 1400. Thereafter, whether to turn on the light emitting unit may be determined according to the illumination intensity value and the light emitting unit may emit light according to the determination.

First, the illumination intensity value may be compared with a pre-set value for a determination (S330). When the illumination intensity value is input to the control unit 1400, the control unit 1400 may compare the received illumination intensity value with a stored pre-set value and determines whether the former is lower than the latter. Here, the pre-set value may be a value for determining whether to turn on the lighting device. For example, the pre-set value may be an illumination intensity value at which a worker or a driver may have difficulty in recognizing an object with the naked eye or may make a mistake in a situation, for example, a situation in which the sun starts to set.

When the illumination intensity value measured by the illumination intensity sensor unit 1200 is higher than the pre-set value, lighting of the light emitting unit may not be required, so the control unit 1400 may shut down the overall system.

Meanwhile, when the illumination intensity value measured by the illumination intensity sensor unit 1200 is lower than the pre-set value, lighting of the light emitting unit may be required, so the control unit 1400 may output a signal to the lighting unit 1300 and the lighting unit 1300 may emit light (S340).

Figure 29:
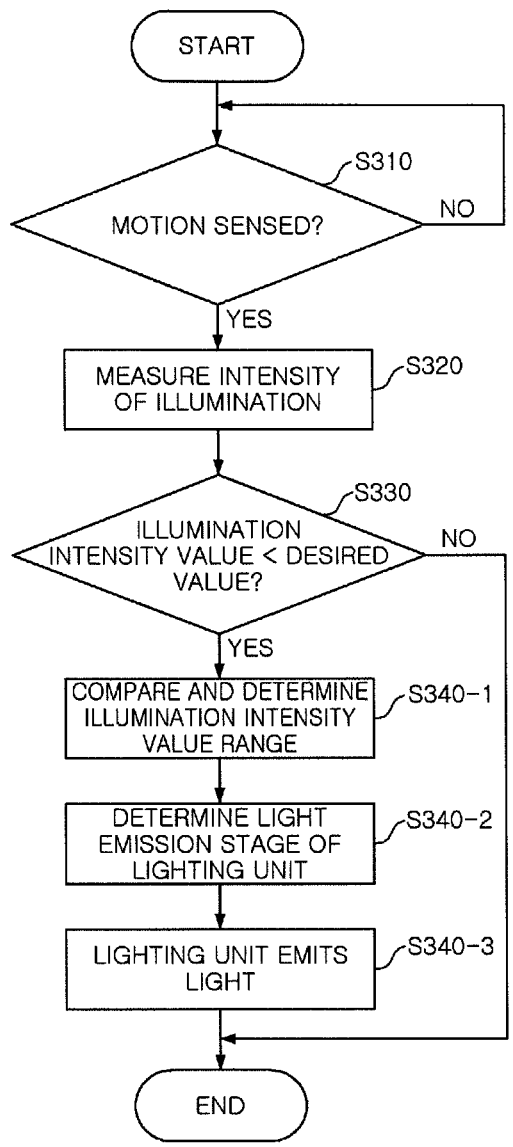
FIG. 29 is a flow chart illustrating a method for controlling a lighting system according to another embodiment of the present disclosure.

FIG. 29 is a flowchart illustrating a method for controlling a lighting system according to another embodiment of the present disclosure. Hereinafter, a method for controlling a lighting system according to another embodiment of the present disclosure will be described. However, the same procedure as that of the method for controlling a lighting system as described above with reference to FIG. 28 will be omitted.

As illustrated in FIG. 29, in the case of the method for controlling a lighting system according to an embodiment of the present inventive concept, an intensity of light emissions of the light emitting unit may be regulated according to an illumination intensity value of a surrounding environment.

As described above, the illumination intensity sensor unit 1200 may output an illumination intensity value to the control unit 1400 (S320). When the illumination intensity value is lower than a pre-set value (S330), the control unit 1400 may determine a range of the illumination intensity value (S340-1). The control unit 1400 may have a range of subdivided illumination intensity value, based on which the control unit 1400 determines the range of the measured illumination intensity value.

Next, when the range of the illumination intensity value is determined, the control unit 1400 may determine an intensity of light emissions of the light emitting unit (S340-2), and accordingly, the lighting unit 1300 may emit light (S340-3). The intensity of light emissions of the light emitting unit may be divided according to the illumination intensity value, and here, the illumination intensity value may vary according to weather, time, and surrounding environment, so the intensity of light emissions of the light emitting unit may also be regulated. By regulating the intensity of light emissions according to the range of the illumination intensity value, power wastage may be prevented and a worker or an operator's attention may be drawn to their surroundings.

Figure 30:
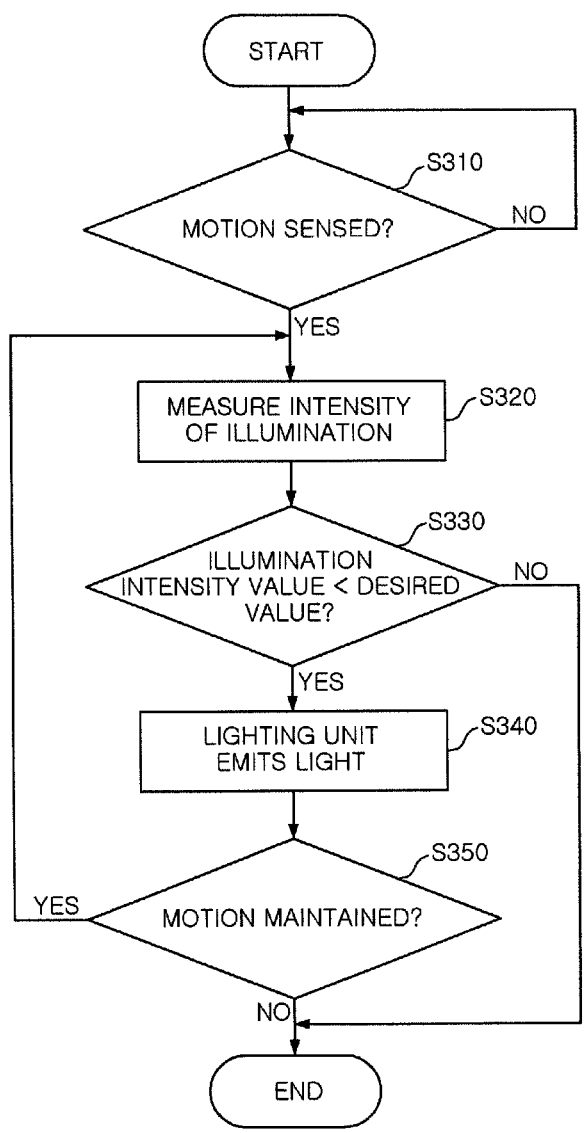
FIG. 30 is a flow chart illustrating a method for controlling a lighting system according to another embodiment of the present disclosure.

FIG. 30 is a flowchart illustrating a method for controlling a lighting system according to another embodiment of the present disclosure. Hereinafter, a method for controlling a lighting system according to another embodiment of the present disclosure will be described. However, the same procedure as that of the method for controlling a lighting system as described above with reference to FIGS. 28 and 29 will be omitted.

The method for controlling a lighting system according to an embodiment of the present inventive concept may further include operation S350 of determining whether a motion of an object to which the lighting system is attached is maintained in a state in which the lighting unit 1300 emits light, and determining whether to maintain light emissions.

First, when the lighting unit 1300 starts to emit light, termination of the light emissions may be determined based on whether a container or a vehicle to which the lighting system is installed moves. Here, when the motion of the container is stopped, it may be determined that an operation thereof has terminated. In addition, when a vehicle temporarily stops at a crosswalk, light emissions of the light emitting unit may be stopped to prevent interference with the vision of oncoming drivers.

When the container or the vehicle moves again, the motion sensor unit 1100 may operate and the lighting unit 1300 may start to emit light.

Whether to maintain light emissions may be determined based on whether a motion of an object to which the lighting system is attached is sensed by the motion sensor unit 1100. When the motion of the object is continuously sensed by the motion sensor unit 1100, an intensity of illumination may be measured again and whether to maintain light emissions may be determined. Meanwhile, when the motion of the object is not sensed, the system may be terminated.

A lighting device according to an embodiment of the present disclosure will be described with reference to FIGS. 31 to 33.

Figure 31:
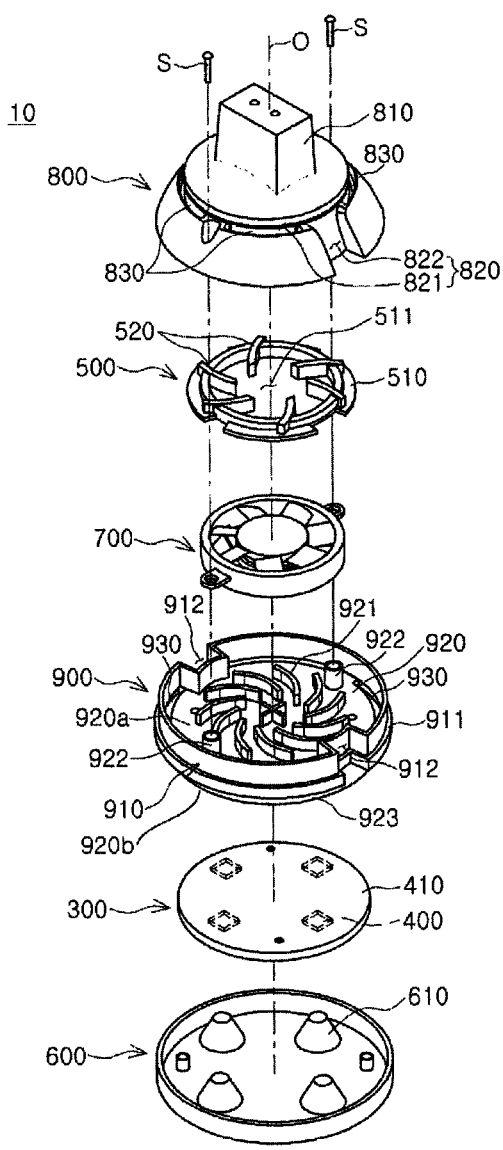
FIG. 31 is an exploded perspective view schematically illustrating a lighting device according to an embodiment of the present disclosure.
Figure 32:
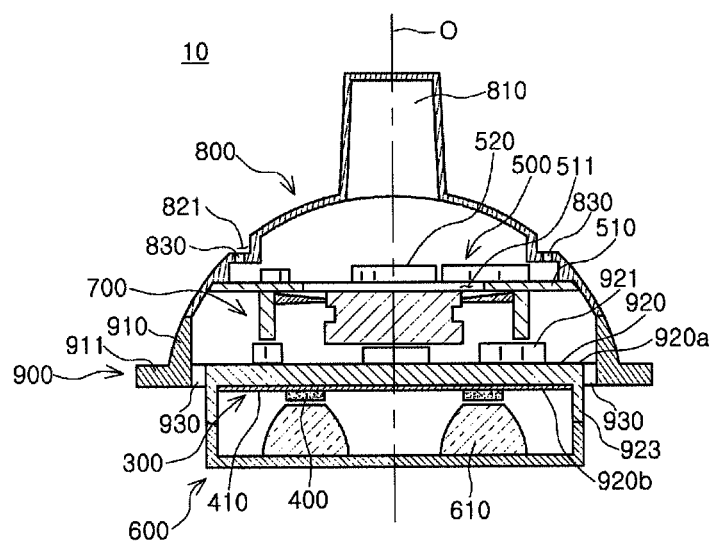
FIG. 32 is a cross-sectional view schematically illustrating a lighting device according to an embodiment of the present disclosure.

FIG. 31 is an exploded perspective view schematically illustrating a lighting device according to an embodiment of the present disclosure, and FIG. 32 is a cross-sectional view schematically illustrating a lighting device according to an embodiment of the present disclosure. In FIGS. 31 and 32, a lamp according to the MR16 standard is illustrated as a lighting device according to an embodiment of the present inventive concept, but the lighting device according to an embodiment of the present disclosure is not limited thereto.

Referring to FIGS. 31 and 32, a lighting device 10 according to an embodiment of the present inventive concept may include a base 900, a housing 800, a cooling fan 700, and a light emitting unit 300.

The base 900 may be a type of a frame member in which the cooling fan 700 and the light emitting unit 300 are fixedly installed. The base 900 may include a fastening rim 910 and a support plate 920 provided within the fastening rim 910.

The fastening rim 910 may have an annular structure perpendicular with respect to a central axis O, and may have a flange portion 911 protruding from a lower end portion thereof in an outward direction. When the lighting device 10 is installed in a structure such as a ceiling, the flange portion 911 may be inserted into a hole provided in the ceiling to serve to fix the lighting device 10.

The fastening rim 910 may have a recess 912 formed to be depressed in a direction toward a central portion of the base 900. The recess 912 may have a shape corresponding to that of a flow path 920 of a housing 800 as described hereinafter, and may be formed in a position corresponding to the flow path 920. Accordingly, the flow path 920 may be formed with the recess 912 in a continued manner, so as to be exposed outwardly through a lower portion of the fastening film 910.

The base 900 employed in an embodiment of the present inventive concept will be described in detail. The support plate 920 may be provided on an inner circumferential surface of the fastening rim 910 and have a horizontal structure perpendicular with respect to the central axis O and may be partially connected to the fastening rim 910. The support plate 920 may have one surface (or an upper surface) 920a and the other surface (or a lower surface) 920b which are flat and opposed to each other, and may include a plurality of heat dissipation fins 921 formed on one surface 920a thereof. The plurality of heat dissipation fins 921 may be arranged radially from the center of the support plate 920 toward the edges thereof. In this case, the plurality of heat dissipation fins 921 may have a curved surface, respectively, and have an overall spiral shape. In the embodiment of FIGS. 31 and 32, it is illustrated that the plurality of heat dissipation fins 921 each having a curved surface are arranged in a spiral manner, but the present inventive concept is not limited thereto and the heat dissipation fins 921 may have any other various shapes such as a linear shape, and the like.

Fixing portions 922 may be formed to protrude to a predetermined height from the one surface 920a. The fixing portions 922 may have a screw hole formed therein to allow the housing 800 and the cooling fan 700 as described hereafter to be fixed thereto through fixing units such as screws S, or the like.

The light emitting unit 300 may be installed on the other surface 920b of the support plate 920. A side wall 923 protruding from the other surface 920b in a downward direction and having a predetermined height may be provided along the circumference of the edges. A space having a predetermined size may be provided within the side wall 923 to accommodate the light emitting unit 300 therein.

An air discharge hole 930 in the form of a slit may be provided between an outer circumferential surface of the support plate 920 and an internal surface of the fastening rim 910. The air discharge hole 930 may serve as a passage through which air is released from the one surface 920a toward the other surface 920b, and thus, air may not be stagnant in the one surface 920a and a continuous air flow may be maintained.

The base 900 may be a part directly in contact with the light emitting unit 300 as a heat source, so it may be made of a material having excellent heat conductivity to perform a heat dissipation function such as that of a heat sink. For example, the base 900 may be formed of a metal, a resin, or the like, having excellent heat conductivity through injection molding, or the like, such that the fastening rim 910 and the support plate 920 are integrated. Also, the fastening rim 910 and the support plate 920 may be fabricated as separate components and assembled. In this case, the support plate 920 may be made of a metal, a resin, or the like, having excellent heat conductivity, and the fastening rim 910 that the user directly grasps in case of an operation such as replacement of a lighting device, or the like, may be made of a material having relatively low heat conductivity in order to prevent damage due to a burn.

As illustrated in FIGS. 31 and 32, the housing 800 may be disposed on one side of the base 900. In detail, the housing 800 may be fastened to the fastening rim 910 to cover the support plate 920. The housing 800 may have an upwardly convex parabolic shape, and a terminal portion 810 may be provided in an upper end portion of the housing 800 and fastened to an external power source (e.g., a socket), and an opening may be formed in a lower end portion thereof and fastened to the base 900. In particular, the housing 800 may include the flow path 820 as a depressed region forming a step with respect to an external surface of the housing 800 to guide an inflow of air from the outside and an air inflow hole 830 allowing air guided through the flow path 820 to be introduced to an internal surface.

The air inflow hole 830 may have an annular shape along the circumference of the housing 800 and may be adjacent to an upper end portion of the housing 800. At least one flow path 820 may have a depressed structure in the form of a recess and may be formed on an outer surface of the housing 800. The flow path 820 may extend upwardly along the outer surface of the housing 800 to communicate with the air inflow hole 830.

In detail, the flow path 820 may include a first flow path 821 formed along the circumference of the housing 800 in a position corresponding to the air inflow hole 830 to communicate with the air inflow hole 830 and a second flow path 822 extending from the first flow path 821 to a lower end portion of the housing 800 so as to be opened outwardly. The second flow path 822 may be formed with the recess 912 of the fastening rim 910 fastened to the lower end portion of the housing 800 in a continued manner, and may extend to a lower portion of the fastening rim 910 so as to be opened outwardly. Accordingly, ambient air may be introduced along the flow path 820 as a portion of the outer surface of the housing 800 from a lower side of the fastening rim 910 and guided in an upward direction, and may be introduced to an internal space of the housing 800 through the air inflow hole 830. In the embodiment of FIGS. 31 and 32, it is illustrated that a pair of second flow paths 822 are provided in a facing manner, but the amount of the second flow paths 822 and positions thereof may be variously modified.

Figure 33:
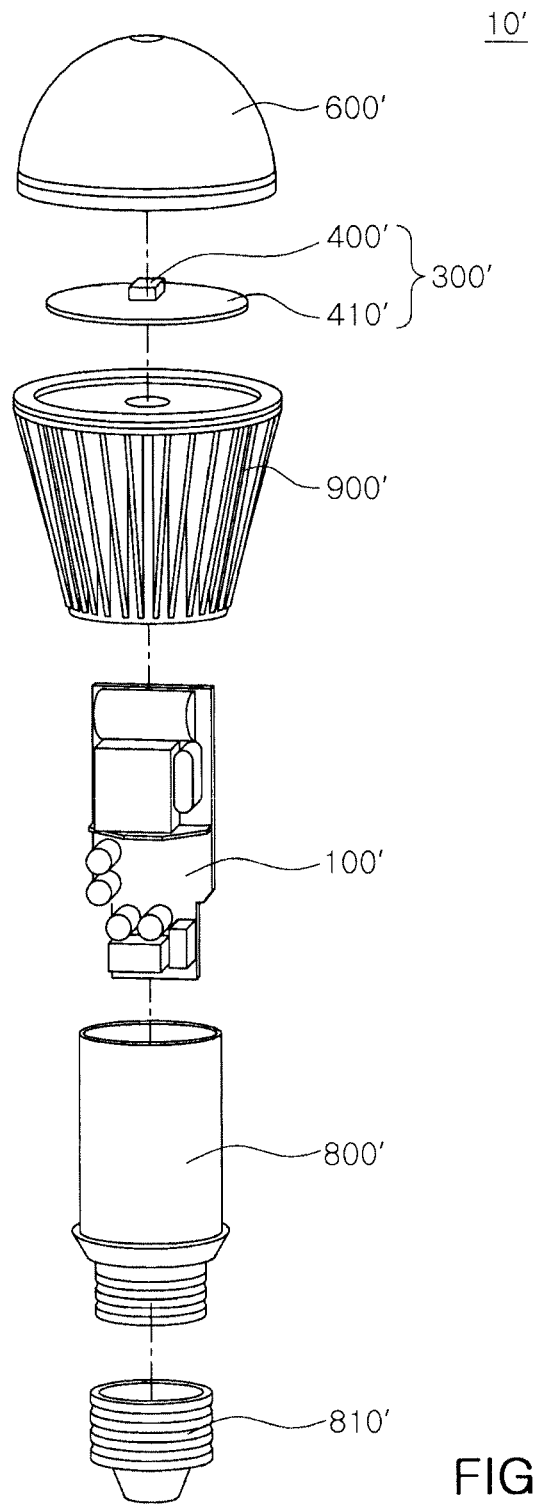
FIG. 33 is an exploded perspective view schematically illustrating a lighting device according to an embodiment of the present disclosure.

FIG. 33 is an exploded perspective view illustrating an example in which a light emitting device package according to an embodiment of the present disclosure is applied to a lighting device.

Referring to the exploded perspective view of FIG. 33, a lighting device 10' is illustrated as, for example, a bulb type lamp, including a light emitting unit 300', a driving unit 100', and an external connection unit 810'. Also, the lighting device 10' may further include external structures such as a housing 800' and a cover unit 600'. The light emitting unit 300' may include a light emitting element 400' having the LED package structure or any structure similar thereto and a substrate 410' on which the light emitting element 400' is mounted. In the embodiment of FIG. 33, a single light emitting element 400' is illustrated as being mounted on the substrate 410', but the present inventive concept is not limited thereto and a plurality of light emitting elements 400' may be mounted as necessary.

Heat generated by the light emitting element 400' may be dissipated through a heat dissipation unit, and a heat sink 900' directly in contact with the light emitting unit 300' to enhance heat dissipation effect may be included in the lighting device 100' according to an embodiment of the present inventive concept. The cover unit 600' may be installed on the light emitting unit 300' to have a convex lens shape. The driving unit 100' may be installed in the housing 800' and connected to an external connection unit 810' having a socket structure to receive power from an external power source. Also, the driving unit 100' may serve to convert received power into an appropriate current source for driving the light emitting element 400' included in the light emitting unit 300' and provide the converted power. For example, the driving unit 100' may include the circuits described above with reference to FIGS. 1, 2, 14, and the like.

Also, the lighting device 10' may further include the communications module as described above.

The lighting device using an LED as described above may be altered in terms of an optical design thereof according to a product type, a location, and a purpose. For example, in relation to the foregoing sensitivity illumination, a technique for controlling lighting by using a wireless (remote) control technique utilizing a portable device such as a smartphone, in addition to a technique of controlling a color, temperature, brightness, and a hue of illumination (or lighting) may be provided.

Also, in addition, a visible wireless communications technology aimed at achieving a unique purpose of an LED light source and a purpose as a communications unit by adding a communications function to LED lighting devices and display devices may be available. This is because, an LED light source advantageously has a longer lifespan and excellent power efficiency, implements various colors, supports a high switching rate for digital communications, and is available for digital control, in comparison to existing light sources.

The visible light wireless communications technology may be a wireless communications technology transferring information wirelessly by using light having a visible light wavelength band recognizable by humans' eyes. The visible light wireless communications technology is discriminated from a wired optical communications technology in the aspect that it uses light having a visible light wavelength band, and discriminated from a wired optical communications technology in the aspect that a communications environment is based on a wireless scheme.

Also, unlike RF wireless communications, the visible light wireless communications technology may have excellent convenience and physical security properties in that it can be freely used without being regulated or permitted in the aspect of frequency usage, is differentiated in that a user can check a communications link with his/her eyes, and above all, the visible light wireless communications technology has features as a fusion technique (or converging technology) obtaining a unique purpose as a light source and a communications function.

As set forth above, according to embodiments of the present disclosure, circuit malfunctions due to a ripple component included in an output voltage from the converter can be prevented by using the cut-off circuit having hysteresis characteristics, and stable operations can be secured during the initial driving (start-up) by using the bleeder resistor.

Advantages and effects of the present disclosure are not limited to the foregoing content and any other technical effects not mentioned herein may be easily understood by a person skilled in the art from the foregoing description.

While the present disclosure has been shown and described in connection with the embodiments, it will be apparent to those skilled in the art that modifications and variations can be made without departing from the spirit and scope of the inventive concept as defined by the appended claims.

What is claimed is:

1. An LED driving device, comprising:
   a first converter configured to generate a first voltage;
   a second converter configured to generate a second voltage for driving a plurality of light emitting diodes (LEDs) from the first voltage; and
   a control circuit connected to an output terminal of the first converter and configured to control a level of the first voltage,
   wherein the control circuit comprises a cut-off circuit including a comparison circuit having hysteresis characteristics and a bleeder circuit.

2. The LED driving device of claim 1, wherein the comparison circuit compares an input signal generated on the basis of the first voltage with a predetermined reference signal.

3. The LED driving device of claim 2, wherein the comparison circuit is a Schmitt trigger circuit.

4. The LED driving device of claim 2, wherein the reference signal corresponds to a minimum voltage to operate the plurality of LEDs.

5. The LED driving device of claim 2, wherein when the input signal is smaller than the reference signal, the comparison circuit performs control to allow a current to flow to the bleeder circuit, and
when the input signal becomes greater than the reference signal, the comparison circuit performs control to cut off the current flowing in the bleeder circuit.

6. The LED driving device of claim 1, wherein the bleeder circuit comprises a switching element controlled in operation by a signal outputted from the comparison circuit, and a bleeder resistor connected to the switching element.

7. The LED driving device of claim 6, wherein the bleeder resistor delivers the first voltage to the second converter under initial driving conditions of the first converter in which the switching element is in a turned-off state.

8. The LED driving device of claim 1, wherein the first converter is a constant current converter, and the second converter is a buck converter.

9. A lighting device, comprising:
a light emitting unit including a plurality of light emitting diodes (LEDs);
a converter unit including a first converter and a second converter connected in series and generating a driving voltage for operating the light emitting unit by using an alternating current (AC) input voltage; and
a control circuit configured to control an operation of the second converter by comparing a first voltage outputted by the first converter with a predetermined reference signal,
wherein the control circuit comprises a comparison circuit having hysteresis characteristics and comparing the first voltage with the reference signal, and a switching element receiving the first voltage through a resistor and controls turning-on and turning-off operations of the switching element according to results of the comparison between the first voltage and the reference signal.

10. The lighting device of claim 9, wherein the switching element comprises:
an input terminal receiving the first voltage through a bleeder resistor; and
a control terminal receiving a control signal generated from the results of the comparison between the first voltage and the reference signal.

11. The lighting device of claim 10, wherein the control circuit comprises a Schmitt trigger circuit receiving an input signal corresponding to the first voltage through an inverting terminal thereof and receiving the reference signal through a non-inverting terminal thereof.

12. The lighting device of claim 11, wherein when the input signal becomes greater than the reference signal, the Schmitt trigger circuit turns off the switching element to cut off a current flowing in the bleeder resistor.

13. The lighting device of claim 11, wherein when the input signal becomes smaller than the reference signal, the Schmitt trigger circuit turns on the switching element to allow a current to flow to the bleeder resistor.

14. The lighting device of claim 10, wherein the bleeder resistor delivers the first voltage to the second converter under initial driving conditions in which the switching element is in a turned-off state.

15. The lighting device of claim 9, wherein the first converter is a constant current converter, and the second converter is a buck converter.

16. An LED driving device, comprising:
a first converter configured to generate a first voltage;
a second converter configured to generate a second voltage for driving a plurality of light emitting diodes (LEDs) from the first voltage; and
a control circuit configured to control an operation of the second converter by comparing the first voltage with a predetermined reference signal,
wherein the control circuit comprises a comparison circuit having hysteresis characteristics and comparing the first voltage with the reference signal, and a switching element receiving the first voltage through a resistor and controls turning-on and turning-off operations of the switching element according to results of the comparison between the first voltage and the reference signal.

17. The LED driving device of claim 16, wherein the switching element comprises:
an input terminal receiving the first voltage through a bleeder resistor; and
a control terminal receiving a control signal generated from the results of the comparison between the first voltage and the reference signal.

18. The LED driving device of claim 16, wherein the control circuit comprises a Schmitt trigger circuit receiving an input signal corresponding to the first voltage through an inverting terminal thereof and receiving the reference signal through a non-inverting terminal thereof.

19. The LED driving device of claim 17, wherein the bleeder resistor delivers the first voltage to the second converter under initial driving conditions in which the switching element is in a turned-off state.

20. The LED driving device of claim 16, wherein:
the first converter is a constant current converter, and
the second converter is a buck converter.

* * * * *